United States Patent [19]

Tsutsumi et al.

[11] Patent Number: 5,310,441
[45] Date of Patent: May 10, 1994

[54] WAFER BINDING METHOD AND APPARATUS

[75] Inventors: Yukio Tsutsumi; Tatsumi Matsumoto; Keisuke Takahashi; Mitsuzi Koyama, all of Tokyo, Japan

[73] Assignees: Mitsubishi Materials Corporation; Mitsubishi Materials Silicon Corporation, both of Tokyo, Japan

[21] Appl. No.: 76,204

[22] Filed: Jun. 14, 1993

Related U.S. Application Data

[62] Division of Ser. No. 800,833, Nov. 29, 1991, Pat. No. 5,254,205.

[30] Foreign Application Priority Data

Nov. 30, 1990 [JP] Japan .................. 2-334104

[51] Int. Cl.⁵ .............................................. B32B 31/00
[52] U.S. Cl. ..................................... 156/382; 156/153; 156/285; 156/493; 51/131.1; 134/76
[58] Field of Search ............... 156/286, 382, 153, 154, 156/285, 285, 493, 538, 556; 29/25.01, 559; 51/131.1, 131.4, 131.5, 277, 281 R; 134/66, 76, 134

[56] References Cited

U.S. PATENT DOCUMENTS

| | | | |
|---|---|---|---|
| 3,475,867 | 11/1969 | Walsh | 51/277 |
| 3,492,763 | 2/1970 | Walsh | 51/277 |
| 3,562,965 | 2/1971 | Lange | 51/277 |
| 4,283,242 | 8/1981 | Regler et al. | 156/154 |
| 4,316,757 | 2/1982 | Walsh | 156/286 |
| 4,736,758 | 4/1988 | Kusuhara | 134/66 |
| 4,936,328 | 6/1990 | Yatabe | 134/66 |
| 5,081,795 | 1/1992 | Tanaka et al. | 51/131.1 |
| 5,095,661 | 3/1992 | Gill, Jr. et al. | 51/277 |
| 5,108,532 | 4/1992 | Thein et al. | 156/382 X |

FOREIGN PATENT DOCUMENTS

251165 10/1988 Japan .

*Primary Examiner*—David A. Simmons
*Assistant Examiner*—James J. Engel, Jr.
*Attorney, Agent, or Firm*—Cushman, Darby & Cushman

[57] ABSTRACT

The present invention relates to a method and an apparatus for automatically binding a silicon wafer to a carrier plate. In the binding method of the present invention, the wafer is positioned underneath the carrier plate and then lifted and bonded to the carrier plate, at or below atmospheric pressure: once this is accomplished the process returns to the previous pressure. In addition, in the apparatus which performs this process, by means of a carrier means which supplies the carrier plate and wafer to the location where binding is to be carried out, the binding surface of the carrier plate and wafer are turned upward, transported and the carrier plate is flipped around in the interval between the carrier plate transportation apparatus and the binding unit.

8 Claims, 35 Drawing Sheets

WAFER BINDING METHOD AND APPARATUS

This is a division of application Ser. No. 07/800,833, filed Nov. 29, 1991, now U.S. Pat. No. 5,254,205.

BACKGROUND OF THE INVENTION

1. Field of the Invention

The present invention relates to an apparatus for binding a carrier plate, used in a silicon wafer polishing apparatus, to a silicon wafer.

1. Prior Art

In the polishing of a monocrystal silicon wafer (hereafter referred to as just "wafer"), a fixed carrier plate is bonded to a plurality of wafer sheets: this carrier plate is then casted into the polishing apparatus and the polishing of the wafer is carried out.

In the prior art disclosed in First Publication Laid open number 63-245366, when a wafer is being bonded to the aforementioned carrier plate, wax has been previously applied to the inside of the wafer as a binding agent. A plurality of wafers are then placed on top of the carrier plate and after adhesion, the bonding was carried out using a pressure binding apparatus, as shown in FIG. 36.

In this apparatus on top of the main frame 80, inside the pressure lowering chamber 81, a press plate 83 is provided. To begin with a carrier plate 91 is placed on top of the pedestal 85, and resting directly above that is a press plate 83 for applying pressure to the wafer 90. At that time, while pressure is being lowered inside the pressure lowering chamber 81, which includes both the carrier plate 91 (on top of the pedestal) and the press plate 83, pressure is being applied to the wafer by the press plate 83. Following the deaeration of the binding surfaces of the wafer 90 and the carrier plate 91, the pressure lowering chamber 81 is returned to normal pressure and the bonding can then be carried out without the existence of air bubbles between the wafer and carrier plate.

However, the minimum line width of the integrated circuit (IC) used in the silicon monocrystal is 1 $\mu$m. Additionally, when trying to form a circuit using optical lithography, due to the shallow depth of focus, a wafer possessing a satisfactory flatness is required. In order to obtain this desired wafer, improvements in both the polishing process as well as in the controlling of the carrier plate flatness are being carried out. There exist additional problems however, during the bonding, in the thickness and the thickness distribution of the wax layer: the wax layer thickness can be no greater than 1 $\mu$m. Furthermore, there were also drawbacks in that refuse was entering into the space in between the carrier plate and the wafer as well as air bubbles were being left behind creating unwanted dimples, on the surface of the wafer following the polishing. Deterioration of the ability to flatten the carrier plate also was a point of concern.

In the bonding procedure of the prior art, when the aperture of the wafer becomes as big as 200 mm $\phi$, the uniform application of pressure becomes difficult. Additionally, when the wafer to which wax has been applied is facing downward, the occurrence of refuse cannot be ignored because a significant problem arises even when small particle refuse gets in between the wafer and carrier plate.

SUMMARY OF THE INVENTION

An object of the present invention is to, when a plurality of wafers are being bonded to a surface of the carrier plate, reduce the thickness of the wax and uniformly distribute the layer in addition to reducing the occurrence of unwanted dimples while at the same time obtaining a desirable flatness. It is also an object of the present invention to provide for both the automatic supply and withdrawal of the carrier plate, wafer and wafer carrier to the binding apparatus.

The present invention, order to obtain the above mentioned objectives, performs the binding of the wafer to the carrier plate through a series of steps. In the first step, the wafer, the upper surface to which a binding agent has been applied (the surface of application of the aforementioned binding agent is turned facing upward) is positioned underneath the carrier plate. When the upper surface of the aforementioned wafer and the underside of the carrier plate are arranged opposite, facing each other, the surrounding pressure is no greater than the atmospheric pressure. In the next step the aforementioned wafer rises and binds to the aforementioned carrier plate. Finally once the wafer and carrier plate are bound to each other, the pressure of the surrounding environment is raised and returned to normal levels.

Through this kind of organization, there is no air disturbance on the binding face because the binding of the wafer and the carrier plate can be performed under reduced pressure. Consequently, the occurrence of air bubbles on the binding face can be prevented and even if the aperture of the wafer is large, the occurrence of dimples is reduced. Additionally as previously mentioned, the binding is carried out under reduced pressure conditions such that the binding face is not disturbed by the air. Moreover, since normal pressure is returned to slowly, uniform pressure is more effectively applied and the thickness of the wax becomes uniform. Furthermore, there is no rolling about of the wafer surface to which wax has been applied and the adhesion of refuse is rare so the undesirable occurrence of dimples is reduced and consequently, a wafer with a desirable flatness can be obtained.

DETAILED DESCRIPTION OF THE PREFERRED EMBODIMENTS

Figure 1:
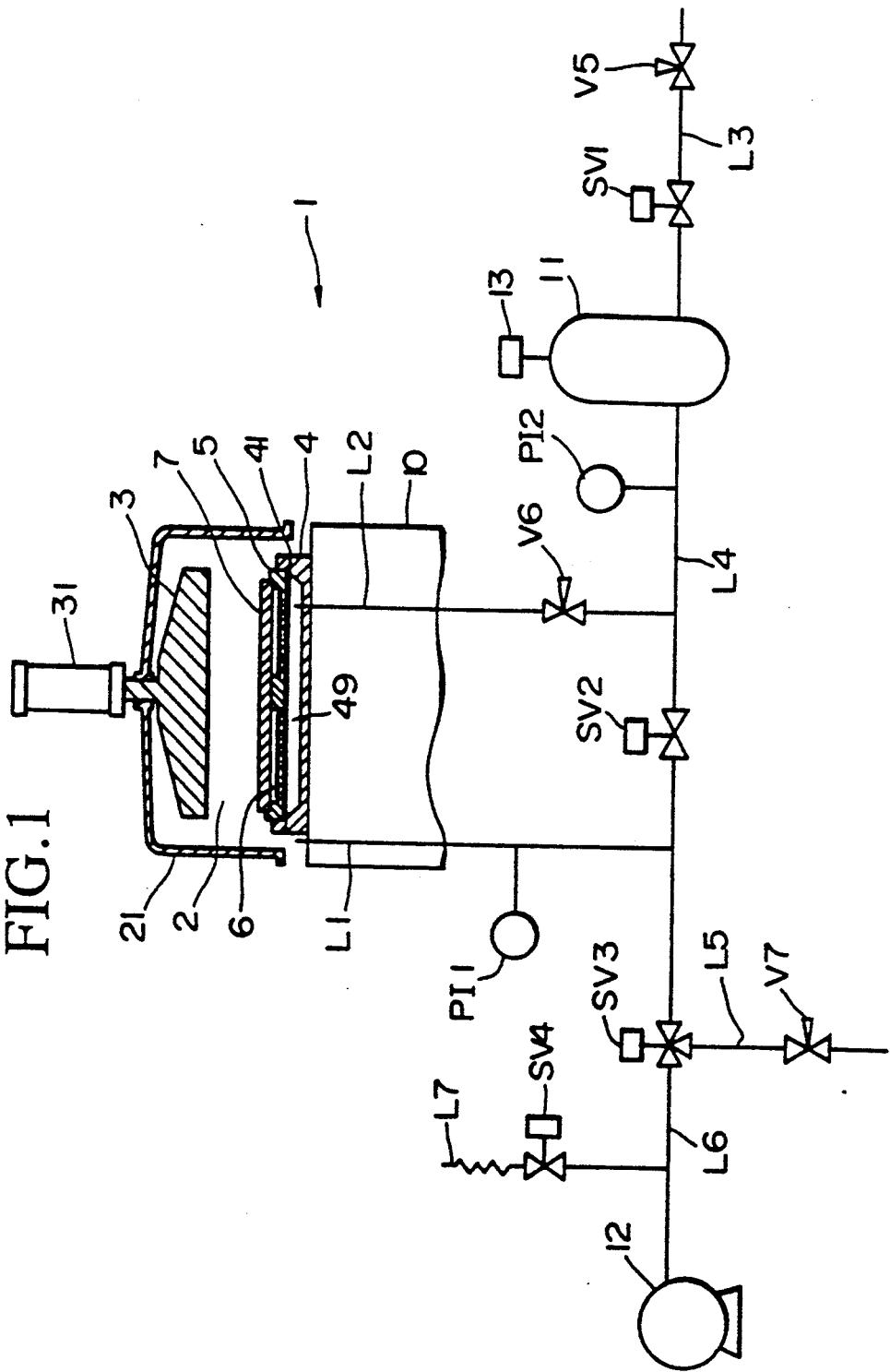
FIG. 1 shows the pipe system of the binding apparatus of the preferred embodiment.

An explanation on the binding unit provided in the wafer apparatus of the present invention is given by referring to FIG. 1 to FIG. 7. Furthermore, in the explanation following hereafter, when using the word wafer, a wafer before polishing is referred to.

The wafer binding unit 1, shown in FIG. 1 (hereinafter simply called binding unit) is substantially constructed by pedestal 4, which is placed on main frame 10, wafer carrier 5, which is supported by pedestal 4, and by press plate 3, which is hung up so that it can be moved up and down by driving cylinder 31 located above. Pedestal 4, wafer carrier 5 and press plate 3 are contained within cover 21 which opens and closes and goes partly up and down with the movement of press plate 3. When cover 21 descends and closes up to the upper surface of main frame 10, the inner part of cover 21 becomes a first decompression chamber 2 which maintains air-tight conditions. This first decompression chamber 2 is deaerated via a first ventilation line L1 which is on line with a pressure control system, and vacuum conditions are created inside this first decompression chamber 2. On the other hand, on the inside of pedestal 4, placed on top of main frame 10, a second decompression chamber 49 is formed, and a second ventilation line L2, which is in series with the aforementioned pressure control system and penetrates partly main frame 10 and pedestal 4, is provided and gives a possibility for deaeration.

Figure 2:
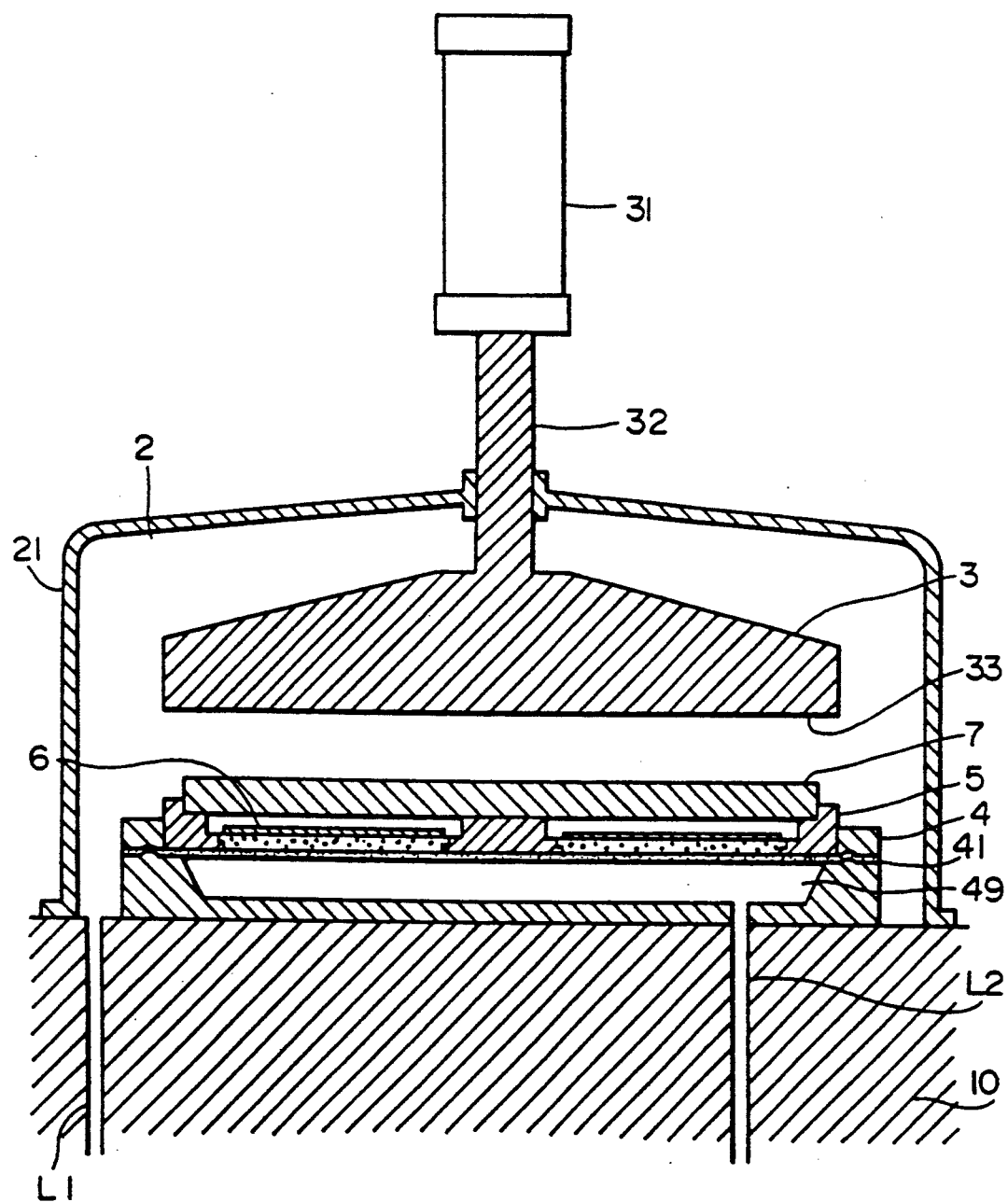
FIG. 2 is a cross section of the principle parts in the binding apparatus.
Figure 5:
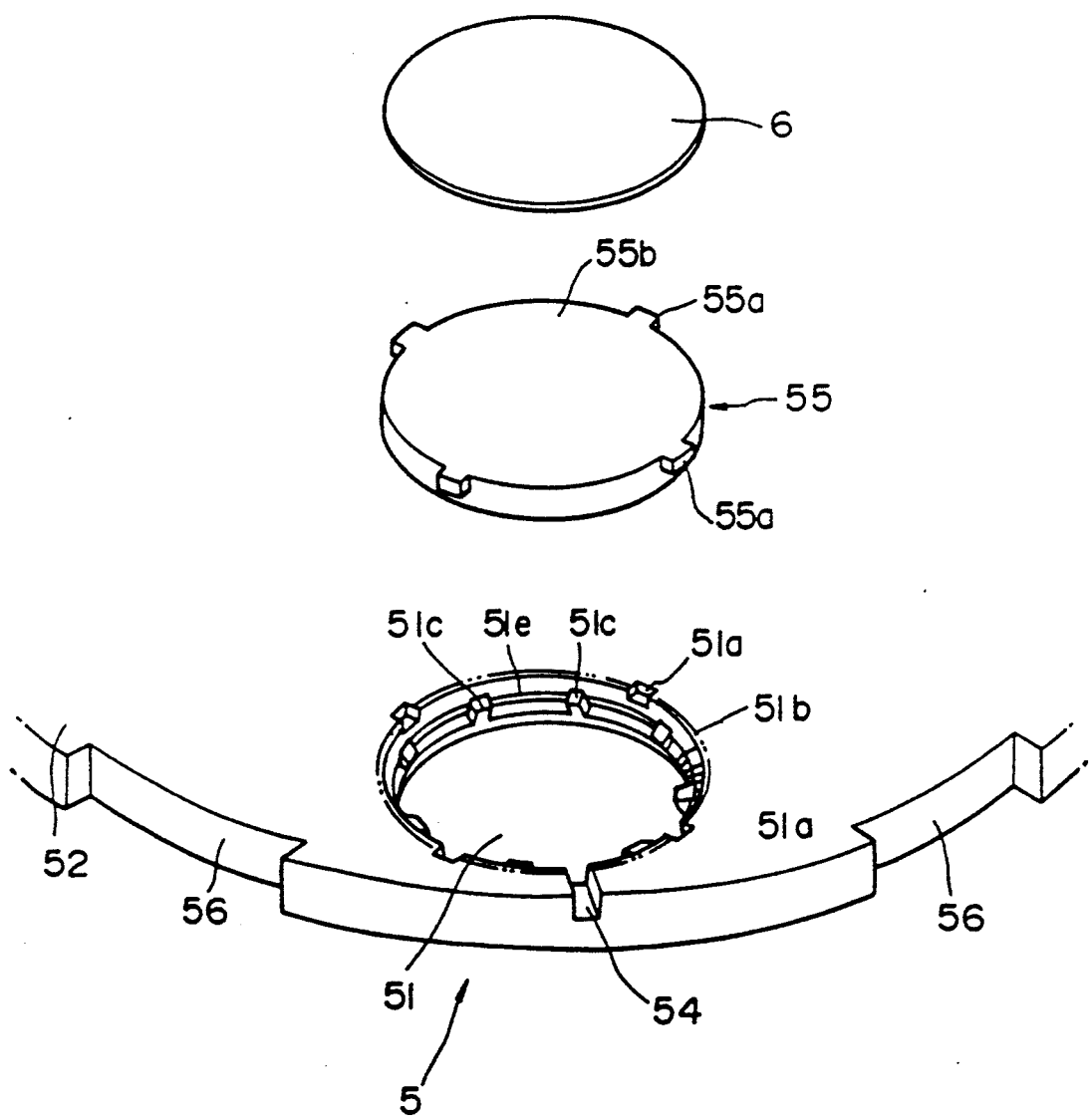
FIG. 5 is a exploded diagram showing the position relations of the wafer carrier and the wafer.

In the present invention, as indicated in FIG. 2, aforementioned first decompression chamber 2 and second decompression chamber 49 are divided by diaphragm 41 provided horizontally in the inner part of pedestal 4 and providing the possibility for controlling each pressure independently. Furthermore, above aforementioned diaphragm 41 wafer carrier 5 maintaining a plurality of wafers 6 and carrier plate 7 bonded to the latter, are placed at a fixed position on this pedestal 4. As shown in FIG. 5, at wafer carrier 5, wafer supporting part 51c is provided and supports the plurality of wafers 6 at a position opposite that of the upper surface of diaphragm 41. Furthermore, a carrier plate supporting plane 51b is formed and supports carrier plate 7 at a position which is of a fixed distance from the upper surface of wafer 6. In such a construction, first decompression chamber 2 and second decompression chamber 49 are equipped with pressure control means controlling the pressure therein; first decompression chamber 2 and second decompression chamber 49 are both decompressed by aforementioned pressure control means; second decompression chamber 49 has a higher pressure relative to first decompression chamber 2; diaphragm 41 is shifted towards carrier plate 7 at a distance greater than the fixed spacing.

Hereinafter, a detailed explanation on the main preferred embodiment follows.

Figure 3:
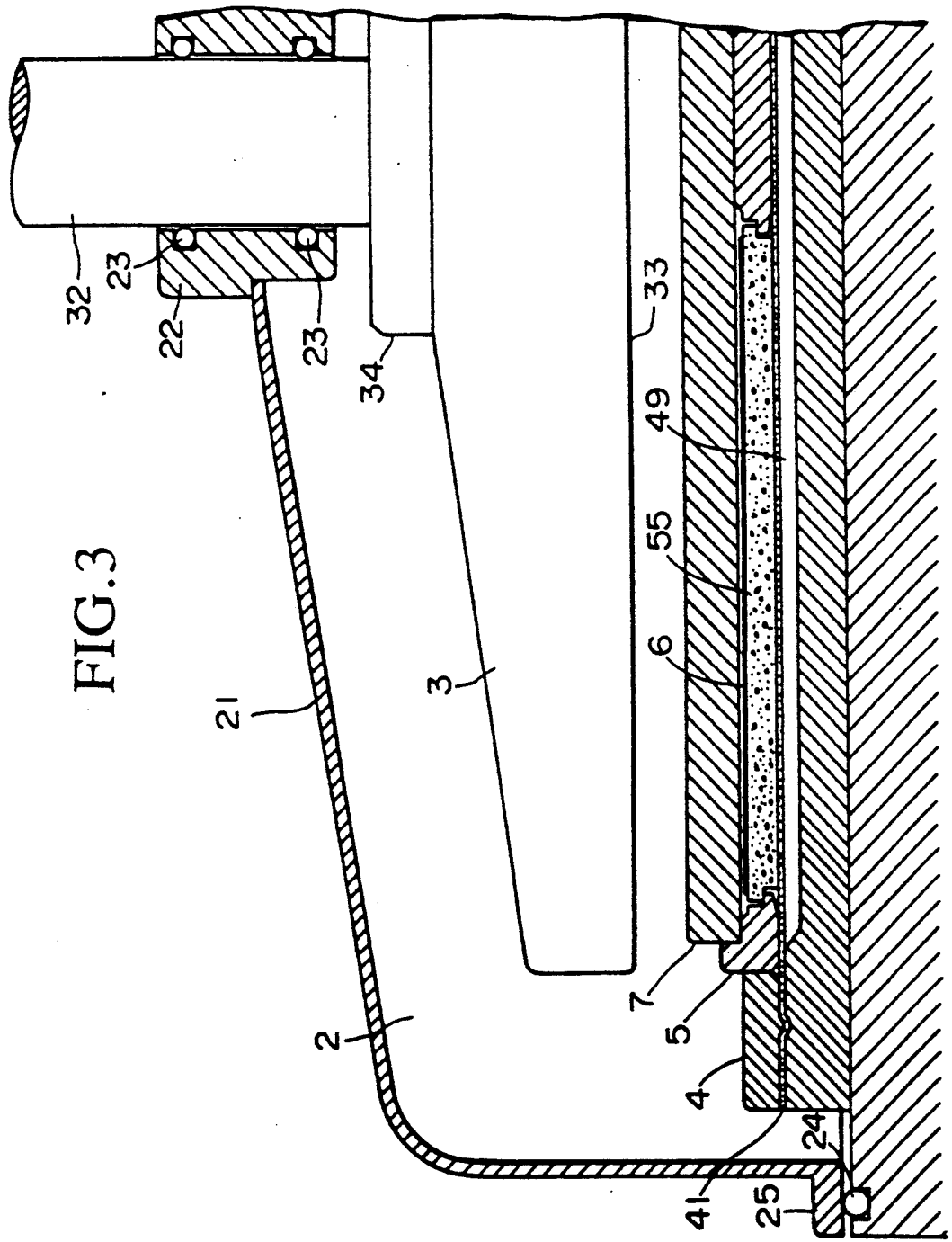
FIG. 3 is an enlarged cross section of one part of the binding apparatus.

Pedestal 4 placed on main frame 10 is formed in a plane round shape and integrates the metal plateau of the lower part, where the inner part was hollowed out to form a flat bowl, and the upper part frame body of the ring. The round and thinly shaped diaphragm 41 is clasped between the upper part frame body and the lower part of the metal plateau. At the clasp part of diaphragm 41, as shown in FIG. 3, the main frame inner diameter of the upper part is taken a little larger than the metal plateau inner diameter of the lower part of pedestal 4, and for supporting the base periphery of wafer carrier 5, which is placed on this pedestal 4, diaphragm 41 is clasped and formed at the part of the different diameters. Diaphragm 41 consists of a membrane body having elasticity and is made from rubber or synthetic rubber, and can deform according to the pressure difference between the upper and lower surface. Thus, the first decompression chamber 2 is divided by diaphragm 41, which is clasped in the inner space of pedestal 4, and second decompression chamber 49 is formed inside the lower part of the metal plateau.

Wafer carrier 5, which is generally disc-shaped on the outside for supporting the plurality of wafers 6, and carrier plate 7 is put inside the upper part of the frame body of aforementioned pedestal 4, and the lower surface of the latter is close to contacting with the upper surface of diaphragm 41.

Figure 4:
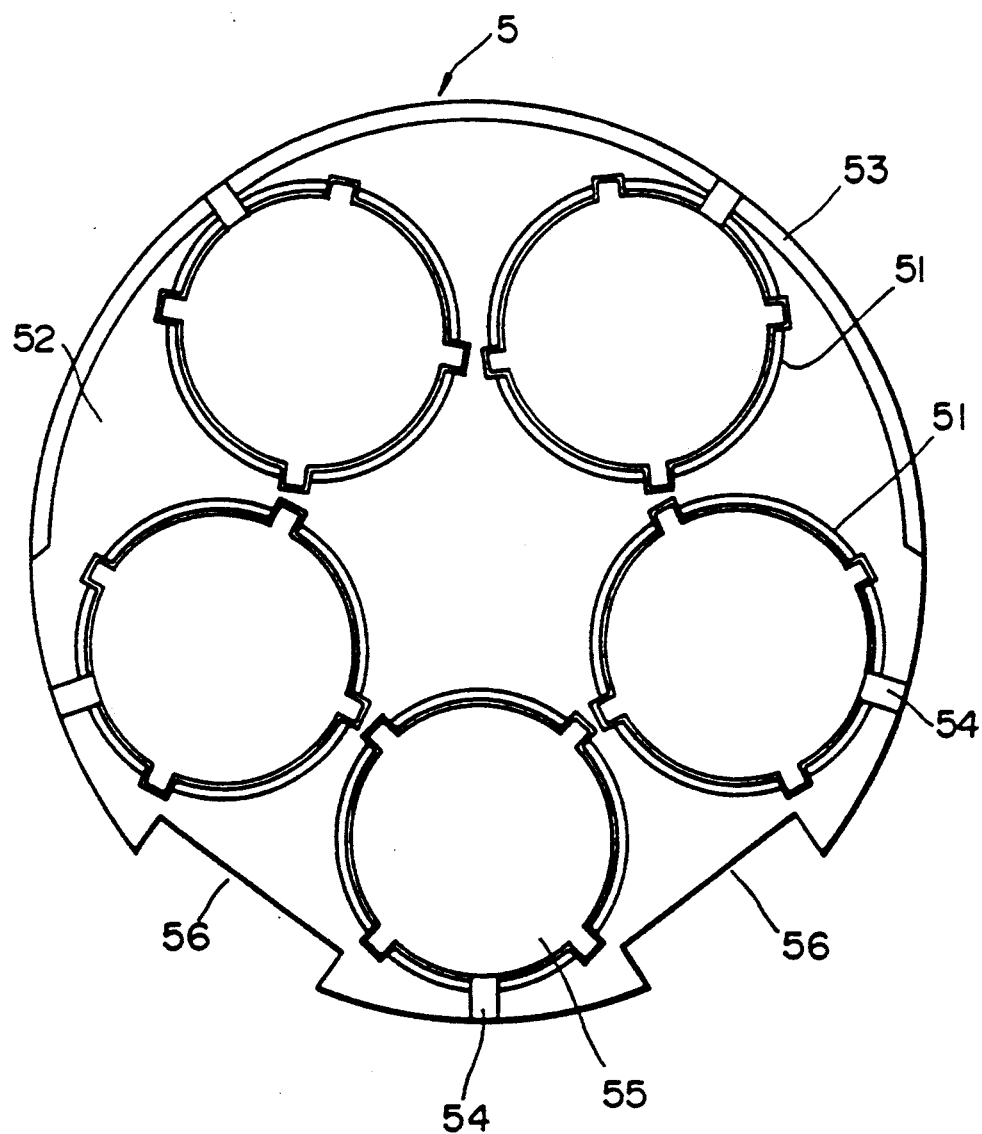
FIG. 4 is a top view of the wafer carrier.

Next, this wafer carrier 5 supports the plurality of wafers 6 and carrier plate 7, is considered to be conveniently dealt with, is made of aluminium or an aluminious alloy, has a membrane coating for smoothening its surface, and was galvanized. In FIG. 4, the upper side of wafer carrier 5 in which wafers 6 are positioned as shown, and to make it possible that the plurality of wafers 6 are equidistantly positioned, wafer insertion holes 51 are provided. The upper surface becomes carrier plate supporting plane 52 for supporting carrier plate 7 above diaphragm 41 at a fixed distance from aforementioned diaphragm 41.

When passing approximately half way round the upper surface periphery at wafer carrier 5, and when putting carrier plate 7 on carrier plate supporting plane 52, carrier plate guidance 53, which is the standing up part for fixing the position, is formed as one body in wafer carrier 5. The guiding notches 56 provided at two locations in FIG. 4 are the supporting parts in case when wafer carrier 5 is installed on, or removed from pedestal 4, and further makes it easier to install and remove carrier plate 7 to wafer carrier 5. Furthermore, an insertion hole kerf 54, is connected at the carrier plate supporting plane 52, and every wafer insertion hole 51, with the outer space of wafer carrier 5, is grooved in: these insertion holes 51 become the communication system between the upper surface aperture of wafer 6, inserted in wafer insertion hole 51, and the outer space of wafer carrier 5.

Figure 6:
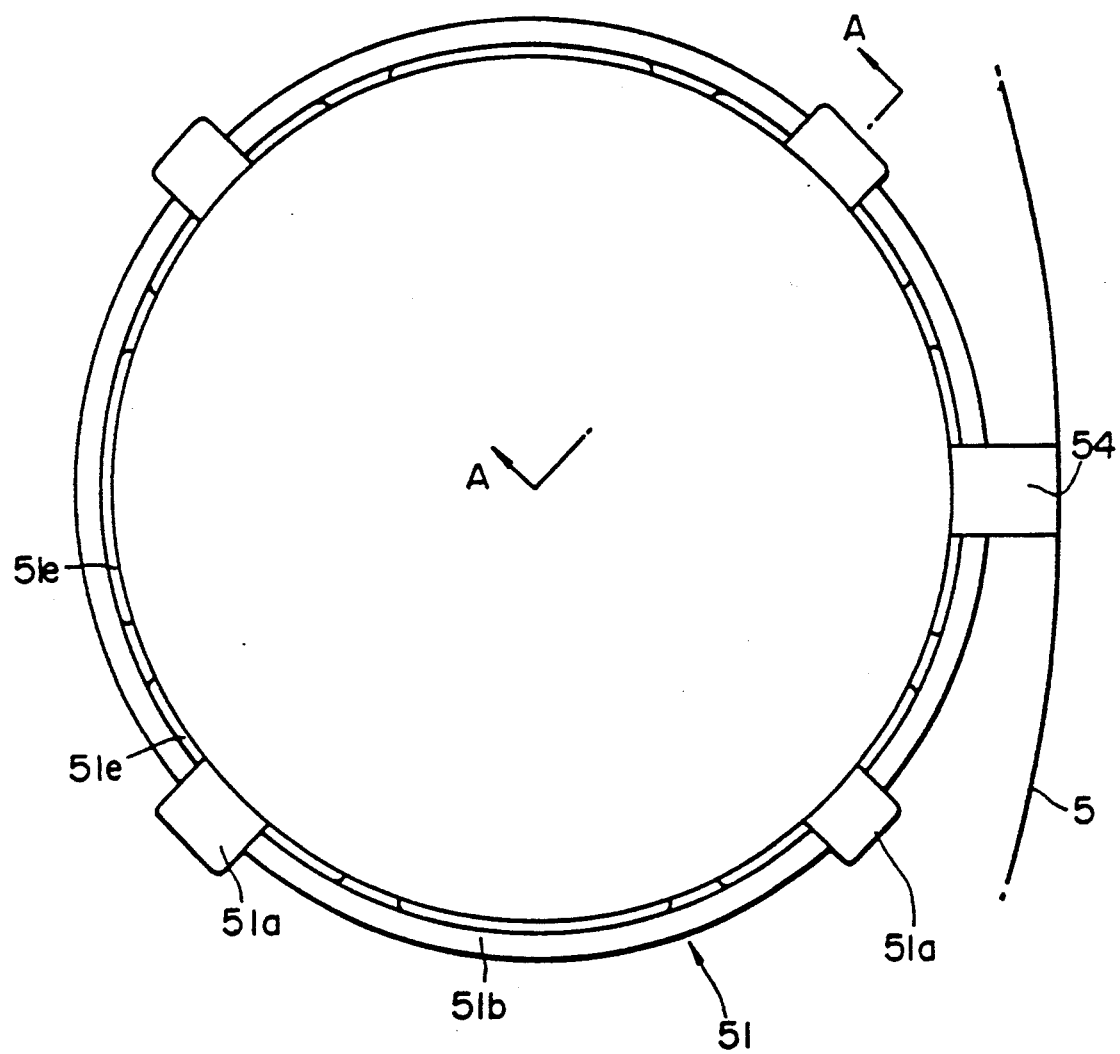
FIG. 6(a) is an enlarged plane view of one part of the wafer carrier and FIG. 6(b) is a side view of one part of the wafer carrier.

Angle chamber 51b is formed at the opening periphery of the wafer insertion holes which are supplied in plurality at carrier plate supporting plane 52 of wafer carrier 5, as indicated in FIG. 5 and 6, in order to make it possible that wafer 6 is easily mounted thereon. At the inner wall of wafer insertion hole 51, a plurality of wafer supporting parts 51c are provided so that wafer 6 can be supported at a lowered position in contrast to carrier plate supporting plane 52. Wafer supporting parts 51c are formed as a plurality of protrusions relative to the upper part of the inner wall of wafer insertion hole 51 by providing missing parts 51e: since these parts are left over around the circumference and located at fixed intervals in the upper part of the inner wall of wafer insertion hole 51, they are in the same vertical plane as the inner wall of insertion hole 51 in downward direction.

Thus, due to the level difference between carrier plate supporting plane 52, supporting carrier plate 7, and wafer supporting parts 51c, which support wafer 6, the fixed space interval between wafer 6 and carrier plate 7 to which the wafer is adhered, can be guaranteed. When considering the deaeration efficiency and the displacement value of diaphragm 41, the space interval between wafer 6 and carrier plate 7 should be as little as possible, for example most preferably in the range of 1 mm to 5 mm, so that there is no direct contact.

Aforementioned insertion hole kerf 54 is grooved out a little deeper than the upper surface of wafer supporting part 51c, and missing part 51e which is supplied at the upper part on the inner wall of wafer insertion hole 51 makes it possible that upper surface cavities of wafer 6 can communicate with the gaps occurring at the lower surface. This is for creating identical conditions for the lower and upper surface of wafer 6 at the time of deaeration of the first decompression chamber 2.

Wafer pressing plate 55 is attached to wafer insertion hole 51 which opens at carrier plate supporting plane 52. For this case, a plurality of nail notch supports 51a (at four places in the same figure) distributed in equal space intervals on the opening periphery of wafer insertion hole 51 are provided with a constant depth, so that press plate support nail 55a notched on wafer pressing plate 55 can be inserted therein.

Wafer pressing plate 55 is for lifting wafer 6 from its lower surface and pressing it up against carrier plate 7: the pressing plate 55 is made of such materials as silicon rubber, fluorine resin, ultrahigh molecular polyester or materials which do not damage the surface of wafer 6 and further have the property of being friction resistant.

The lower surface of the pressing plate 7 directly contacts the upper surface of diaphragm 41 and thickness is provided so that pressing side 55b in FIG. 5, rests on wafer supporting parts 51c. In other words, the upper surface of wafer pressing plate 55 almost comes in contact with the lower surface of wafer 6. However, in order to enable wafer pressing plate 55 to move freely up and down inside the tube of wafer insertion hole 51, it is loosely fit into the horizontal plane defined by aforementioned pressing plate support nails 55a and nail notch supports 51a.

Figure 6B:
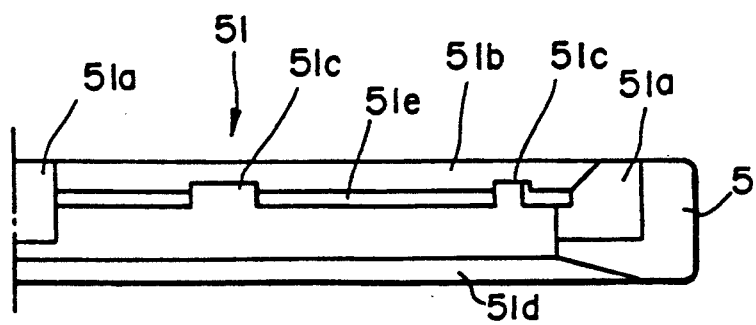

At the lower surface of wafer carrier 5, as indicated in the A—A cross section view of FIG. 6(b), angle chamber 51d is provided at the lower surface opening part circumference of wafer insertion hole 51. When wafer carrier 5 is placed on the upper portion of the frame body of pedestal 4, the upper surface of diaphragm 41 contacts the base of wafer pressing plate 55 which is attached to the base of wafer carrier 5 and wafer inserting hole 51. However angle chamber 51d is provided for assuring the necessary shift value when diaphragm 41 is dislocated in upward direction and for pressing sufficiently wafer pressing plate 55 against carrier plate 7. Considering the arrangement of all the construction members, the wafers as well as the carrier plates adhering to the wafers, in the inner part of pedestal 4 fixed on top of main frame 10 there is a second decompression chamber 49 formed and divided by diaphragm 41, and above this aforementioned diaphragm 41, wafer carrier 5 is located and contacts the upper surface of diaphragm 41. Furthermore, wafer pressing plate 55 is attached to wafer insertion hole 51 which opens at wafer carrier 5, and this base forms a plane nearly identical to the base of wafer carrier 5 and further contacts the upper surface of diaphragm 41. On the other hand, wafer 6 is located on top of wafer supporting part 51c of wafer insertion hole 51. Wafer supporting part 51c is positioned a little lower than carrier support plane 52, and the position of wafer 6 is also below the carrier plate support plane 52 of wafer carrier 5. Wafer carrier 7 is supported by carrier plate supporting plane 52 which contacts wafer carrier 5.

In other words, wafer carrier 5 supports wafer 6 through wafer supporting part 51 at a position above diaphragm 41 and facing the upper surface of diaphragm 41. Wafer carrier 5 supports carrier plate 7 by carrier plate supporting plane 52 at a position between wafer carrier 5 and upper surface of wafer 6 at a fixed space interval. In connection with the explanation on pressboard 3 and cover 21 it should by mentioned that pressboard 3 which is pressed against the upper surface of carrier plate 7, which is attached to the upper part of wafer carrier 5, is installed such that it can move up and down. In the present invention there is no need for putting positive pressure on pressboard 3, and the rising of plate 7 can be prevented when pressure is applied to the upper surface of plate 7 by pressplane 33.

As shown in FIG. 3, at the upper part of cover 21 a rod sheath 22 is provided. A cylinder rod 32 passes through this rod sheath 22, in line with driving cylinder 31 of pressboard 3. Air tight sealing is attained by O-rings 23 contacting the inner surface of rod sheath 22 and the outer surface of cylinder rod 32, which also provides the possibility of sliding contact. At the lower end of cover 22 flunge 25 is formed. When lowering cover 22, the lower surface of flunge 25 contacts the surface of main frame 10, whereby airtightness is assured by O-ring 24, and thus, first decompression chamber 2 formed inside aforementioned cover 21 is shut tightly. When wafer 6 and carrier plate 7 are taken out and put in, the lower end of rod sheath 22 is supported by flange 34, which is used as a connection of pressboard 3 and cylinder rod 32, and when pressboard 3 is lifted up, also cover 21 goes up and the upper surface of main frame 10 is opened.

For the up and down movement of pressboard 3 air or oil pressure driving means, not shown in the figure, are used, and sensors and limit switches for determining the position of the actuators, as well as such things as timers for setting the time of the action process are provided. Furthermore, the up and down movement of press plate 3 is controlled with a pressure system by a control apparatus utilizing program control equipment.

Explanations on the pressure control means of the main equipment are given with reference to FIG. 1.

First ventilation line L1 leading to the first decompression chamber 2 provides a vacuum meter PI1 measuring the vacuum in the first decompression chamber 2 and is connected to pipe L6 leading to vacuum pump 12 via three way manifold valve SV3. Furthermore, second ventilation line L2 leading to the second decompression chamber 49 is connected to pipe L4 via adjustment valve V6 and having a branch in the middle. The other side of aforementioned pipe L4 is divided by valve 2 and connected to aforementioned first ventilation line L1. At pipe L4 vacuum meter PI2 which measures the vacuum density in the second decompression chamber 49 is attached, accumulator 11 easing sudden pressure changes is provided, and on the other side aforementioned pipe L4 is connected via valve SV1 to pipe L3. This pipe L3 is closed and opened to the atmosphere by adjustment valve V5 on the other end. Pressure switch 13 for controlling the closing and opening of valves SV1 and SV2 is installed at accumulator 11. The opening on the other end of aforementioned three way manifold valve SV3, which divides first ventilation line L1 and pipe L6 is connected to pipe L5 which closes and opens to the atmosphere via adjustment valve V7. Furthermore, pipe L6 leading to vacuum pump 12 provides a branch in its mid-section. From this branch pipe L6 is connected to pipe L7 which connects this branch via valve SV4 to the open atmosphere.

In the aforementioned pipe system, air pressured or electromagnetic diaphragm valves or butterfly valves may be used. Furthermore, as an adjustment valve V6 may serve a flux control valve such as a bellow taking into account inner part leakages. By these pressure control means decompression is performed in the first decompression chamber 2 and second decompression chamber 49, both located in the main equipment, and furthermore, second decompression chamber 49 may be overpressured in relation to first decompression chamber 2.

Figure 7:
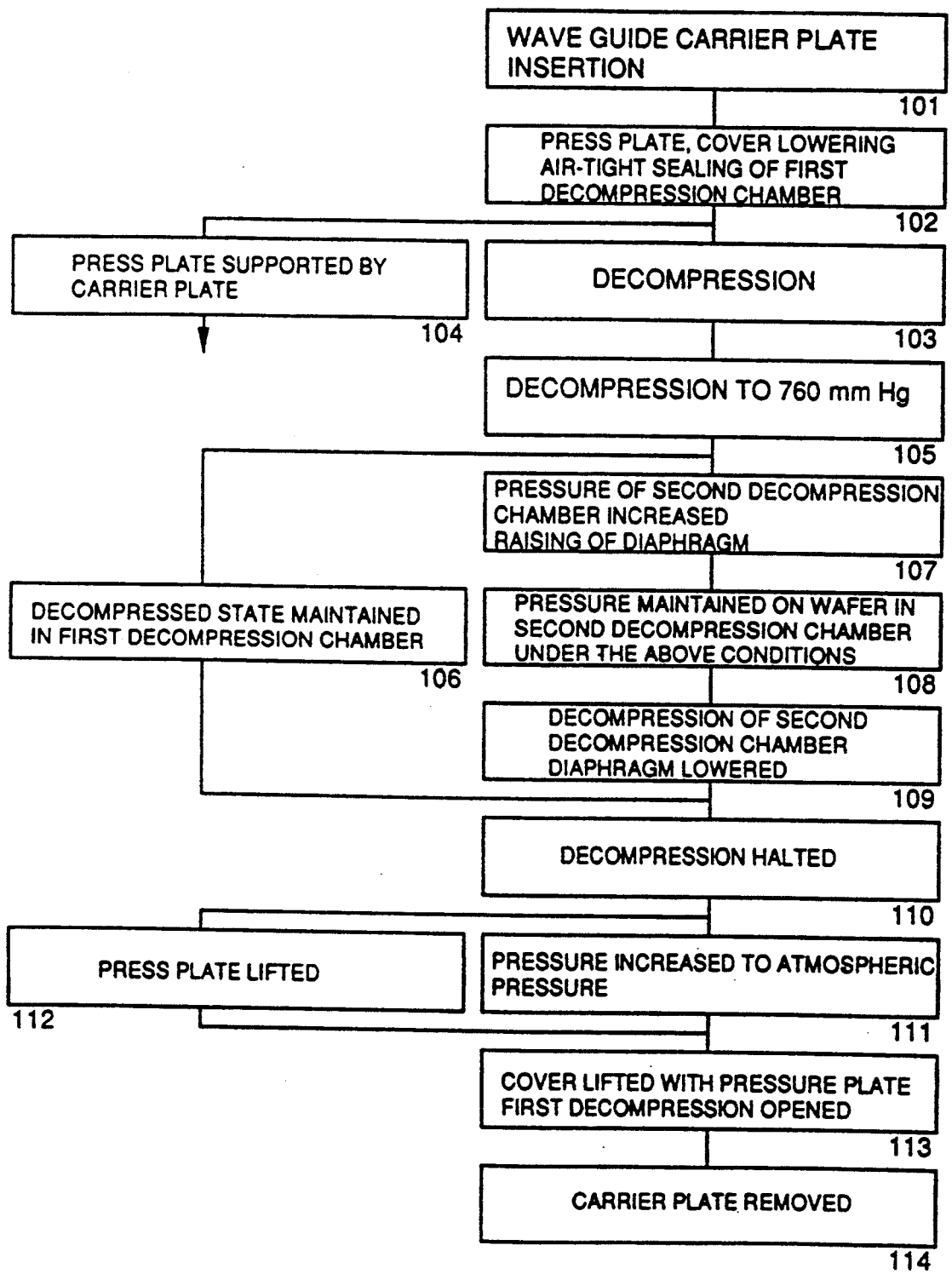
FIG. 7 is a flow chart of the actions carried out by the binding unit.

The action of binding unit 1 in the preferred embodiment is explained by referring to the process chart displayed in FIG. 7.

First, pressboard 3 and cover 21 are caused to have a lifted standby condition by the operation of the pressboard driving system (not shown in the figure). The upper surface of main frame 10 is opened, wafer carrier 5 where wafer 6 is located is placed on pedestal 4, and carrier plate 7 is placed on the upper part of wafer carrier 5 (step 101). Then the operation of the equipment is started, by lowering pressboard 3 cover 21 is lowered and sticks to the upper surface of main frame 10 (step 102). Pressboard 3 is further lowered, and press plane 33 is moved to the position until it directly contacts the upper surface of carrier plate 7 and then stops (step 104).

While cover 21 is fixed, the first decompression chamber 2 and second decompression chamber 49 are connected to the piping system which is connected to vacuum pump 12 and the decompression is started (step 103). At this time, vacuum pump 12 is in action, valves SV1, SV4 are closed valve SV3 closes pipe L5, valve SV2 is open and first decompression 2 and second decompression chamber 49 are both deaerated via first ventilation line L1 and second ventilation line L2. Then, first decompression chamber 2 and second decompression chamber 49 are deaerated below the pressure of 1 mmHg (step 105).

Then valve SV2 is shut, valve Sv1 is opened, air enters via pipe L3, and the pressure in the second decompression chamber 49, which is ventilated from the second ventilation line L2 and connected to pipes L4 and L3, is gradually increased. By the pressure increase of the second decompression chamber 49 diaphragm 41 is lifted up, and wafer 6 is pressed against the lower surface of carrier plate 7 by wafer pressing plate 55 (step 107). The decompression status is continually maintained for the first decompression chamber 2 (step 106). when the pressure in the second decompression chamber 49 is increased to a value between 300 mmHg and 400 mmHg, pressure switch 13 of accumulator 11 actuates and valve SV1 shuts. Only the pressure of the second decompression chamber 49 is maintained at the aforementioned condition, and during this period a pressure on wafer 6 is maintained (step 108). Once wafer 6 is pressed against carrier plate 7, the applied wax causes it to stick to the lower surface of carrier plate.

Valve SV2 is opened and pipe L4 is connected to the first ventilation line L1, pipe L6 and vacuum pump 12. The second decompression chamber 49 again is decompressed and put to equal pressure with first decompression chamber 2. By this, diaphragm 41 goes down to restore the original state (step 110). After that, valve Sv1 and valve SV3 leading to pipe L5 are opened, and the pressure in the first decompression chamber 2 and second decompression chamber 49 is simultaneously increased to atmospheric pressure (step 111). When first decompression chamber 2 goes back to atmospheric pressure wafer 6 sticks to carrier plate 7.

Then press plate 3 is lifted up (step 112) and along with press plate 3 cover 21 is lifted up and the upper surface of main frame 10 is opened (step 113). Thereafter, carrier plate 7 to which wafer 6 is adhered is taken out (step 114).

When the job is started vacuum pump 12 is caused to operate for the first time in step 103, but when continually entering the next batch, it is possible to return to step 101 while vacuum pump 12 is operating. When the job is terminated, vacuum pump 12 is stopped after valve SV4 has been opened. Furthermore, the operational binding unit 1 moving in such a way along with the driving system of a normal pressboard is controlled by an identical control apparatus and automated.

Next, a plurality of wafers 6 above diaphragm 41 are kept in a position facing the upper surface of diaphragm 41. Carrier plate 7 is maintained at a position facing the upper surface of aforementioned plurality of wafers 6 at a fixed interval there in between.

At the beginning first decompression chamber 2 and second decompression chamber 49 are simultaneously decompressed. When first decompression chamber 2 is deaerated, also the air in the cavity of wafer 6 and carrier plate 7 is sucked out. Thereafter, while the decompressed status of decompressed chamber 2, second decompression chamber 49 is overpressured relative to first decompression chamber 2 by causing the pipe system to leak through the second decompression chamber 49. When doing this, the pressure difference between first decompression chamber 2 and second decompression chamber 49 causes the elastic diaphragm 41 to shift for a fixed interval in upward direction of carrier plate 7 of the first decompression chamber 2. Wafer 6 is pressed via wafer pressing plate 55 of wafer carrier 5, which is put in the upper surface of diaphragm 41, against the lower surface of carrier plate 7. Wax is put on the backside of the wafer (upper surface inside the equipment), and by this wax wafer 6 is carried by the lower surface of carrier plate 7. Thereafter, first decompression chamber 2 and second decompression chamber 42 are equalized, diaphragm 41 is put into its starting position; and when first decompression chamber 2 and second decompression chamber 49 are opened to the atmosphere, wafer 6 carried by the lower surface of carrier plate 7, is uniformly covered with wax by applying hydrostatic pressure: since no air reaches this binding plane, dimple impurities due to occurrence of air bubbles are prevented.

Another advantage of the present invention lies in the wafer binding used in the aforementioned wafer binding unit. In other words, the upper surface of the wafer and the carrier plate binding it are arranged at a position of fixed interval, facing each other and are allowed to be treated under reduced pressure. A plurality of wafers is simultaneously lifted from its lower surface and bound to the carrier plate. Thereafter, a-pressure increase is carried out.

Binding part 1 is explained hereafter. At the first decompression chamber 2 a plurality of wafers 6 and carrier plate is positioned. Aforementioned wafer carrier 5 is used so that wafer 6 and carrier plate 7 maintain a fixed position relation. In other words, the plurality of wafers 6 and carrier plates 7 are positioned so that they face each other and the interval there in between lies in the range of 1 mm to 5 mm. The first decompression chamber 2 is decompressed below 1 mmHg. Then the plurality of wafers 6 are simultaneously lifted up to carrier plate 7 and pressed to bind. Wax, wherein rosin is added to a parafinic resin, is beforehand applied on wafer 6 or carrier plate 7, and by means of this wax, wafer 6 is carried by carrier plate 7. In this state, when the first decompression chamber 2 is pressured up until atmospheric pressure, wafer 6 is bound to carrier plate 7.

Binding is carried out by this binding part, and the LTV smoothness is lower than 0.5 $\mu$m in an area of 20 mm $\times$ 20 mm on polished wafer which has a diameter of 200 mm. When polishing was performed under the same polishing conditions in prior art binding parts, LTV smoothness was ±1.0 $\mu$m, and thus the improvement is obvious.

In the aforementioned binding part of the present invention wafer 6 is pressed against carrier plate 7 by the shifting of diaphragm 41, and with regard to the effective use of the decompression means the transfer is performed in the upward direction of wafer 6 by the pressure difference between the first decompression chamber 2 and the second decompression chamber 49. However, for example, it is possible to press the wafer against the carrier plate by using such things as a table moving up and down the plane by means of a driving cylinder which is able to move in vertical direction under decompression.

In binding part 1 a wafer press board 55, which operates indirectly via diaphragm 41 against the lower surface of wafer 6, is attached to wafer carrier 5. This aforementioned press board 55 is designed for shifting pressure in an upward direction in order to stabilize wafer 6, though the supporting means for keeping wafer 6 and carrier plate 7 at a fixed distance may be of different shape. It is also possible for the upper surface of diaphragm 41 to come in direct contact with the lower surface of wafer 6.

Since the present invention has the aforementioned construction, the effects stated hereafter may be listed.

1. The fixed interval between the wafer and the carrier plate is deaerated by decompression, and when a direct contact forms a binding plane under decompression, it is impossible that air penetrates therein. Accordingly, the occurrence of air bubbles on the binding plane can be prevented, and dimple impurities can be limited even on wafers with a big diameter.
2. As mentioned before, binding is achieved under decompression whereby penetration of air into the binding plate is prevented, and since there is a gradual return to normal pressure, a more uniform pressure can be obtained and wax can be distributed to a more uniform thickness.
3. Because the wafer to one side of which wax was applied cannot be turned over, and because the adhering amount of refuse is decreased, the occurrence of dimples is also decreased.
4. For the shift-up of the wafers the same pressure control system is used for the decompression chambers. Accordingly, it is not necessary to use other driving means for the shift-up and the apparatus construction may be simple.

Next, with reference to FIG. 8, the outline of the wafer binding system, which includes means for supplying carrier plate 7 and wafer 6 to the aforementioned binding part and means for taking out carrier plate 7 binding wafers 6 from the binding part, will be explained.

To begin with there is a carrier plate stock part 100. Carrier plate 7 is carried in to this carrier plate stock part 100 by transportation means 102. Carrier plate 7 which is located in the carrier plate stock part 100 is transported to washing apparatus 106 by transportation means 104. In this washing apparatus 106 the washing is carried out for attaining the smoothness necessary for the binding surface of the wafer. Each carrier plate 7 can be located in an upright position in the aforementioned washing apparatus 106, and further can be successively fed into washing units 108, 110,112 where the washing is done by the washing liquid of the container.

Carrier plate 7 which is washed by aforementioned washing apparatus 106, is sent to spin drying apparatus 114 and then rotated in the aforementioned spin drying apparatus 114. Water drops on the surface are removed by the centrifugal force which occurs during the rotation.

Dried carrier plate 7 in aforementioned drying apparatus 114 is sent to heating apparatus 118 by transport means 116 and dried. This heating apparatus 118 has three heating units 120,122,124. By these, successive heating is carried out and the surface temperature is caused to rise to a level which is suitable for the binding.

Each transport of a carrier plate between heating units 120 to 124 is done by transport means 126 provided on both sides of heating apparatus 118.

Carrier plates 7 which are in aforementioned heating apparatus 118 are sent to binding part 128 which was explained in detail before. Reversing pedestal 130 receiving temporarily carrier plate 7 before binding and reversing pedestal 132, which receive temporarily carrier plate 7 after binding are provided respectively in the front and back of binding part 128.

Following the arrangement sequenced of aforementioned binding part 128 and reversing pedestals 130, 132, carrier plate transporter 134 is provided thereafter. By this carrier plate transporter 134, the transportation of carrier plates 7 between these machines is attained.

Hereinafter, an explanation on the means transporting wafer carrier 5, which is loaded with wafers 6 to aforementioned binding part 128, is given.

Furthermore, there is centering apparatus 140, washing apparatus 142, wax coater 144, hot bake apparatus 146 and position alignment apparatus 148 for aligning the position of OF (orientation flat). Centering apparatus 140 aligns the position of each wafer 6 supplied in fixed order on the basis of their quality data, so that they are positioned concentrically in line on the equipments 141 to 148. After being washed by washing apparatus 142, positioned aligned wafers 6 are coated by wax coater 144 with the binding material (wax). Then, ingredients such as organic solvents are removed by heating the wafers by means of hot bake apparatus 146. Wafers 6 which have past the hot bake apparatus 146 are aligned at fixed orientation in OF position alignment apparatus 148. Furthermore, there are transport means 150 for transporting wafers 6 between each of the aforementioned apparatuses.

Position aligned wafers 6 in OF position alignment apparatus 148 are put on wafer carrier 5 in wafer setting apparatus 152. Wafer carrier 5 is placed on wafer carrier holder 154 and put on wafer setting apparatus 152 by waver carrier transporter 146. Wafer 6 is set from OF position alignment apparatus 148 to wafer carrier 5 placed on wafer setting apparatus 152 by wafer setting robot 158. Proceeding like this, wafer carrier 5, where wafer is set in fixed position, is forwarded to wafer binding part 128 by wafer transporter 156 and sent to cooling apparatus 160 after being bonded to carrier plate 7.

Aforementioned cooling apparatus 160 consists of first, second and third cooling units 162,164 and 166. By a successive transfer between them, gradual cooling is carried out. Carrier plate 7, which is cooled down to room temperature while passing through cooling apparatus 160, is forwarded to the next polishing process (not shown in the figure) by delivering apparatus 168.

In the following, the construction of carrier plate stock part 100 is explained with reference to FIGS. 9–11.

Figure 8:
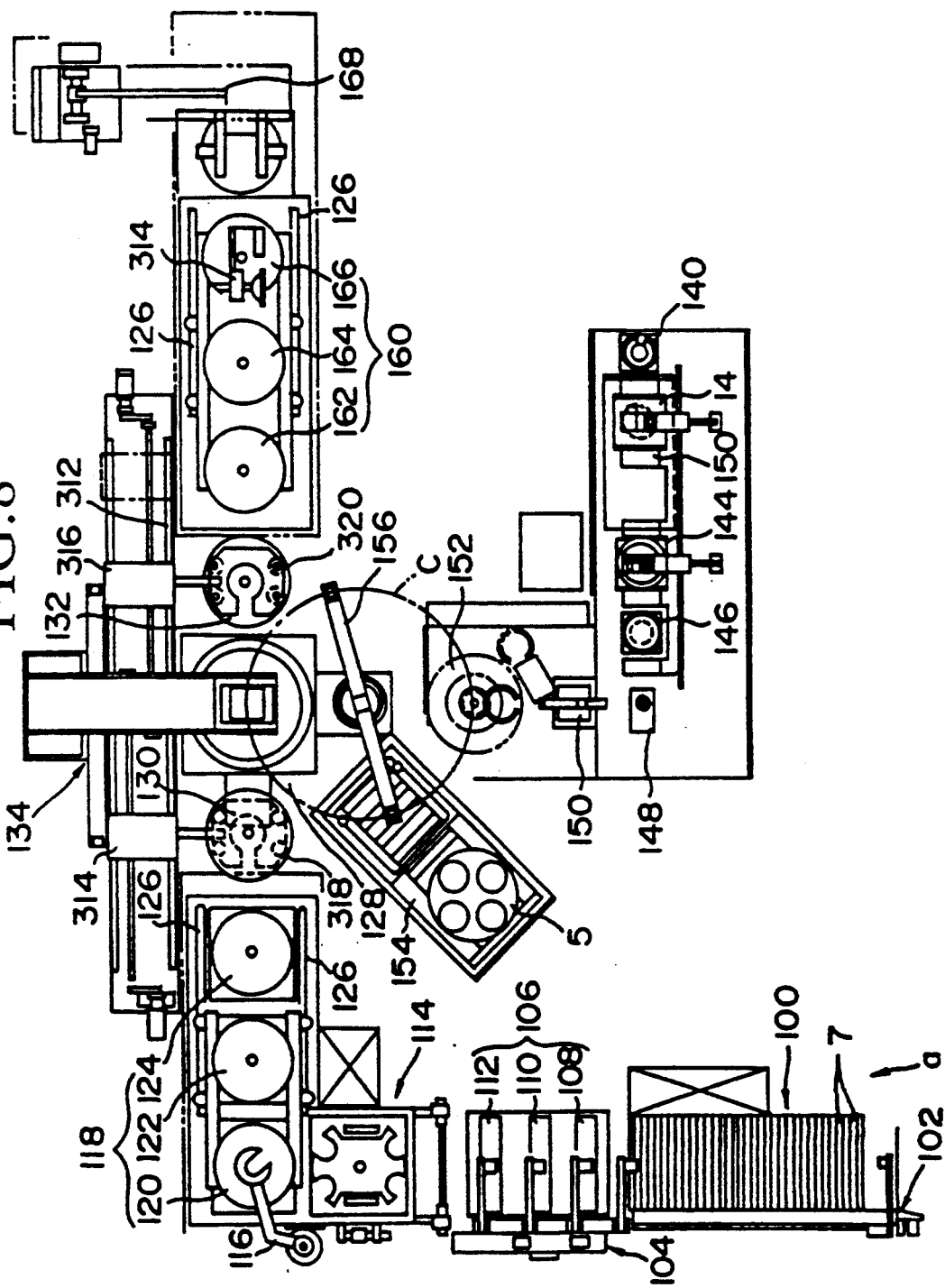
FIG. 8 is a plane view showing the layout of the binding apparatus.

A pair of fixed frames 180 are provided in line with the arrangement direction of carrier plate 7 (in direction of arrow a in FIG. 8). Between these fixed frames 180, a pair of rails 182 are provided. On these rails 182 a moving frame 184 is provided, which is movable along the length direction of rails 182. On this moving frame 184 a vertical movement part 186 is provided which is able to move up and down in vertical direction. Vertical movement part 186 is driven up and down by the pneumatic machine (not shown in the figure) provided inside moving frame 184. At aforementioned fixed frame 180 and vertical movement part 186, carrier supporting members 188,190 are provided respectively and therein a plurality of notches 192 are provided for supporting carrier plate 7.

Carrier plate 7 supported by carrier supporting member 188 of aforementioned fixed frame 180 is moved from one notch 192 consecutively to adjacent notches 192 according to the movement of moving frame 184 and vertical movement part 186 as described hereinafter.

Figure 9:
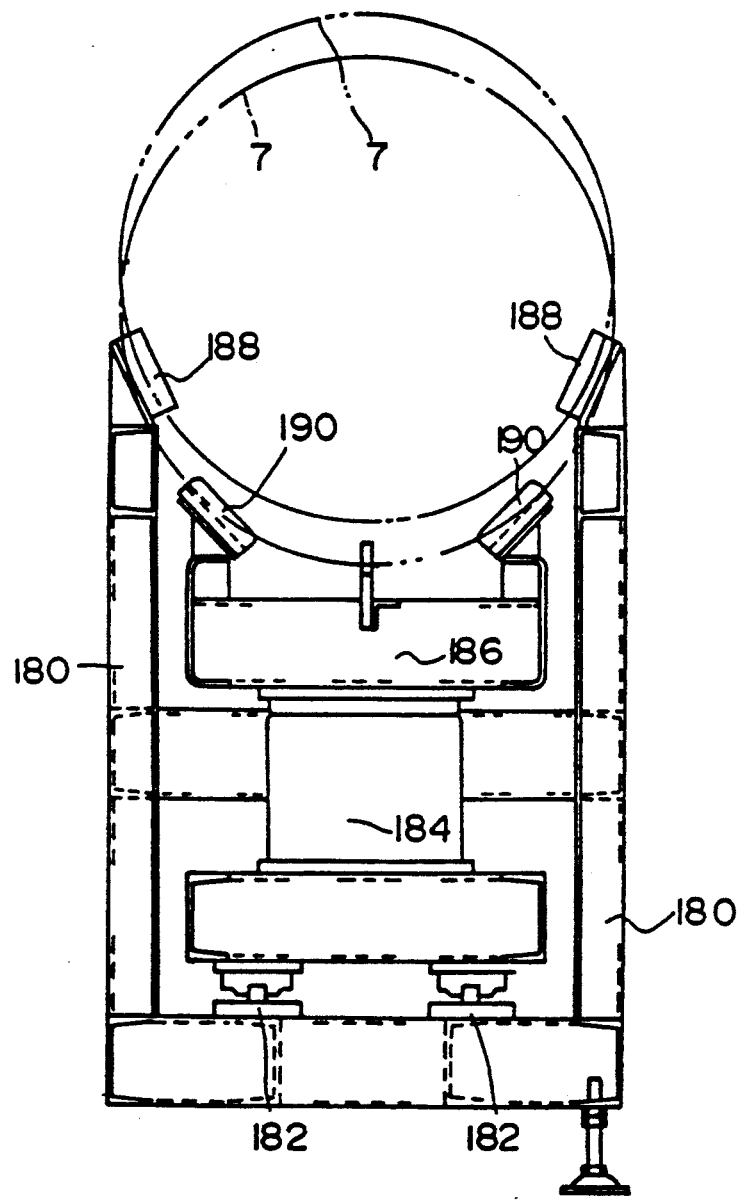
FIG. 9 is a front view of the carrier plate stock part.
Figure 10A:
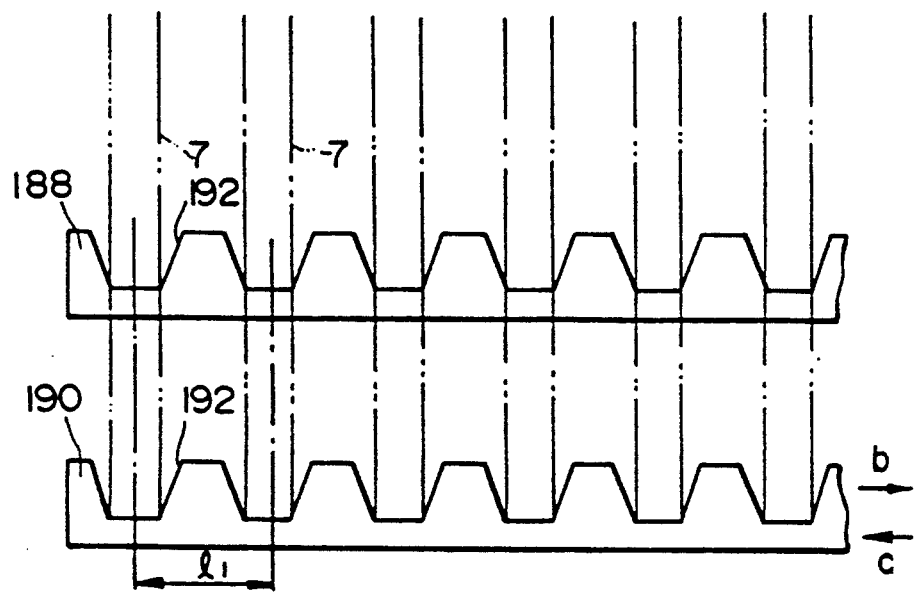
FIGS. 10(a) and 10(b) are side views of the fixed frame and the moving frame.
Figure 10B:
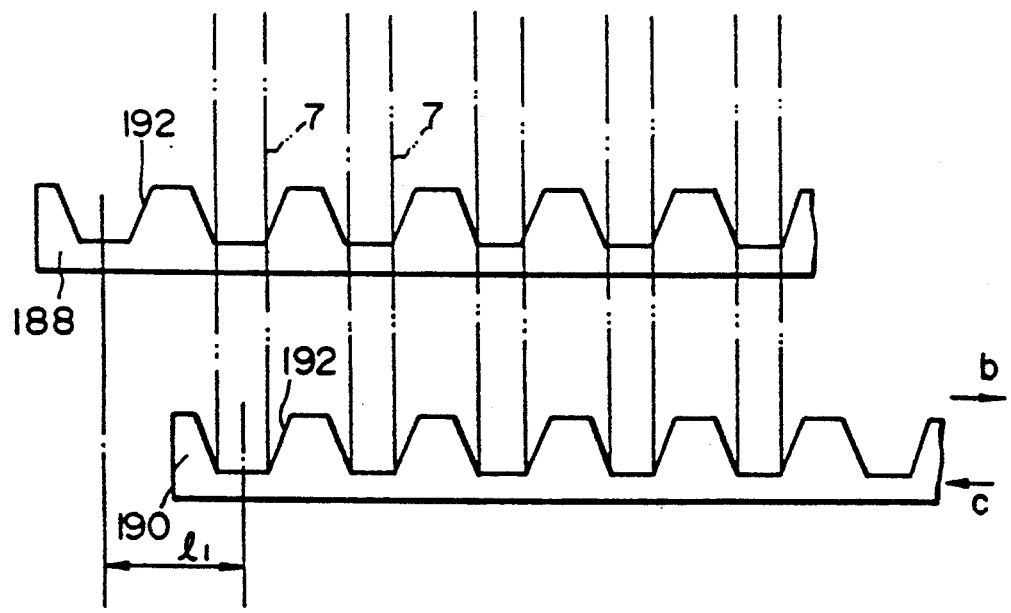

1. since under normal conditions vertical movement part 186 is in the lowered position, shown in FIG. 9, carrier plate 7 is supported by carrier supporting members 188 of the fixed frame 180. As shown if FIG. 10(a) carrier supporting members 188, 190 are positioned in complete alignment with respect to notches 192.
2. When vertical movement part 186 is lifted, carrier supporting member 190 lifts carrier plate 7 and carrier plate is lifted as indicated by the dotted line in FIG. 9.
3. When in this elevated condition, moving frame 184 moves in the direction of arrow b, as indicated in the figure, carrier supporting member 188,190, as indicated in FIG. 10(b), is dislocated at a distance 11 which corresponds to the arrangement interval of notch 192.
4. When in this position vertical movement part 186 is lowered, carrier plate 7, which is supported by supporting member 197, is supported by carrier supporting member 188.
5. When moving frame 184 is moved in the direction of arrow as indicated in the figure, after vertical movement part 186 is lowered, the positioning of the notches of carrier supporting parts 188,190 is completed and becomes the next operatory condition of the movement.

By repetition of the aforementioned movement, carrier plates 7 are forwarded one after the other to the next process by moving always at a distance equal to arrangement interval 11 of notch 192.

Figure 11:
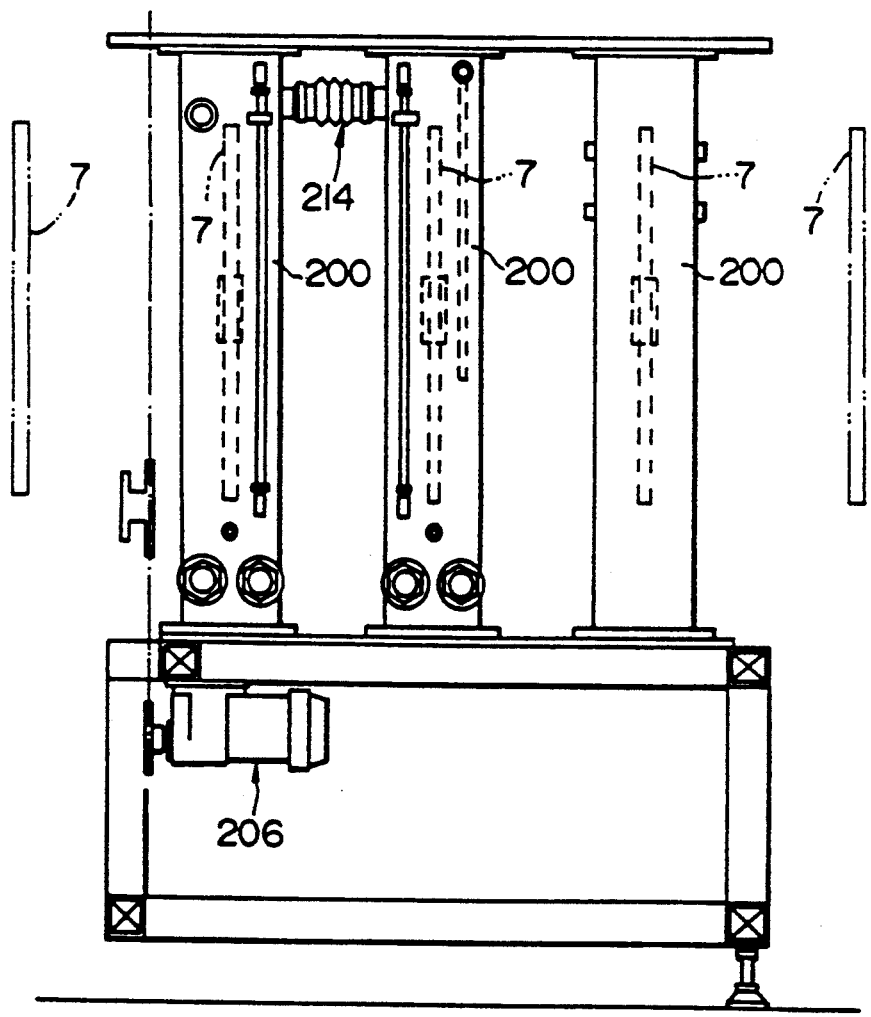
FIG. 11 is a side view of the washing apparatus.
Figure 12:
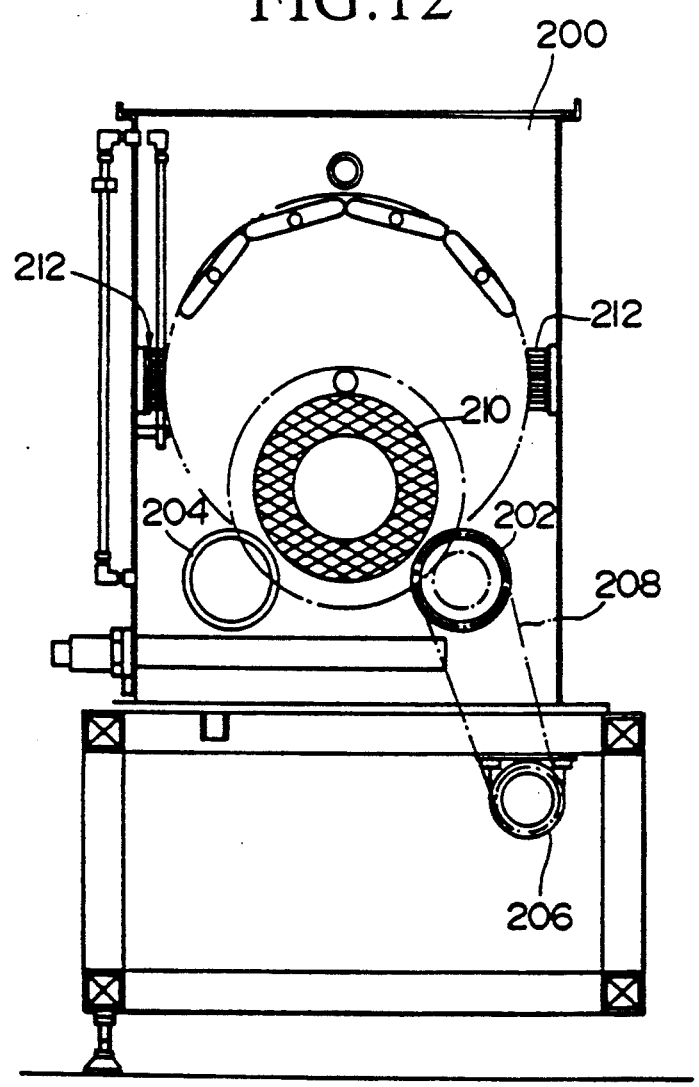
FIG. 12 is a front view of the washing apparatus.
Figure 13:
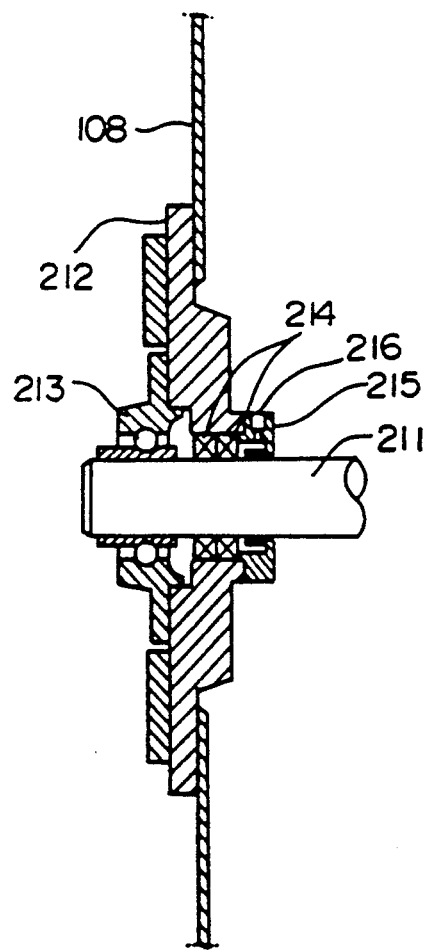
FIG. 13 is a cross section of the bearing part of the washing apparatus.

Next, the construction of the washing apparatus 106 is explained by referring to FIGS. 11–13.

In washing apparatus 106 three washing drums 108, 110,112 are provided. In the lower part of each washing drum 108,110,112 turning rollers 202 and 204 are provided, and by means of these rollers 202, 204 carrier plate 7 is supported from the beneath. Turning roller 202 rotates by means of a force generated by motor 206 and transmitted via belt 208: turning roller 204 is supported so that it can rotate freely according to the rotation of carrier plate 7. Inside washing drums 108, 110,112 a circular rotating brush 201 is provided. Since this circular rotating brush 210 is driven by the driving motor (not shown in the figure), by contacting and rotating the surface of carrier plate 7, this surface is washed. Furthermore, inside washing drums 108, 110, 112 a brush 212 is provided which contacts the outer circumference of carrier plate 7. In the case of the preferred embodiment, the washing is done with an alkaline washing liquid in washing drums 108 and 110. In washing drum 112 washing is carried out by clear water, though kind and combination of the washing liquid is not limited thereby. In the preferred embodiment, the upper part of washing drums 108, 110 are connected by connection pipe 214.

The rotating body containing turning rollers 202, 204 and rotating brush 210, all provided in aforementioned washing apparatus 106, is maintained by a bearing penetrating the wall of washing drums 108, 112. This bearing is sealed and therefore prevented from leaking. The construction of the bearing part is explained by referring to FIG. 13, which shows an example of a washing drum 108.

Also in the figure, axis 211 which supports turning roller 204 is provided. On the outside of washing drum 108 flange 212 is installed. On this flange 212 bearing 213, which supports aforementioned axis 211 for free rotation, is provided. At the inside of aforementioned bearing 213 an oil seal 214, sealing the gap between the inner circumference of flange 212 and the outer circumference of axis 211, is provided. At the inside of aforementioned oil seal 214 a nearly ring shaped cover 215 is installed. Between this bearing cover 215 and aforementioned oil seal 214 a gap is provided which is parallel to the direction of the axis. Between the inner circumference of bearing cover 215 and the outer circumference of axis 211 an extremely small aperture in radial direction is provided. In the aforementioned cover 215, a hole 216 directed in a radial direction is provided. By normally pouring the liquid (normally clear water, washing liquid) into bearing cover 215 via the hole 216, it becomes possible to exclude alien substances, occurring because of contact between the aforementioned oil seal 214 and axis 211, from getting to the outside of washing drum 108.

The charging and decharging of carrier plate 7 to the aforementioned apparatus 106, and the movement of carrier plate 7 between washing drums 200, is carried out by transport apparatus 104. This transport apparatus 104 is explained with reference to FIGS. 14 and 15.

Figure 14:
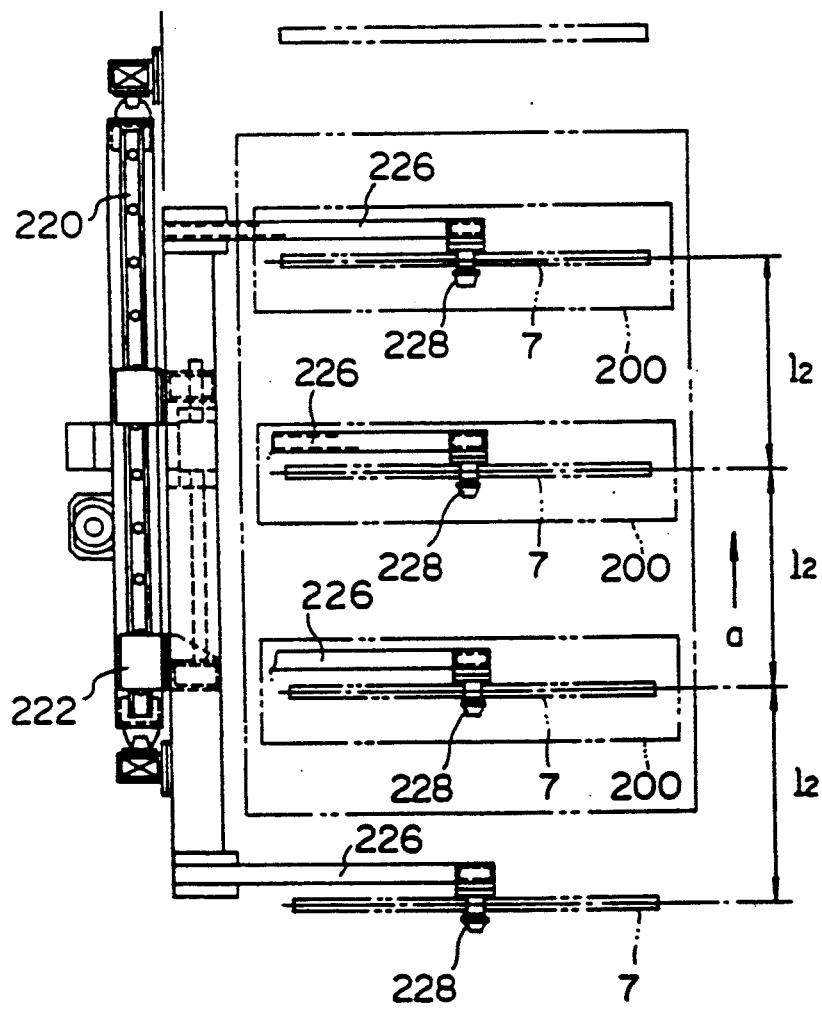
FIG. 14 is a plane view of the transport apparatus provided in the washing apparatus.

At the outer part of the aforementioned washing apparatus 106, rails 220 are provided which follow the arrangement line of washing drums 108, 110, 112. On this rail 220, moving frame 222 is provided. Furthermore, vertical movement frame 224 is provided on moving frame 222. To this vertical movement frame 224, four carrier plate transport arms 226 are attached. Between these carrier plate transport arms 226 intervals 12 are provided, whereby this interval is equal to the respective intervals between washing drums 108, 110, 112. At the end of every aforementioned carrier plate transport arm 226, a protrusion 228 is provided and has an outer diameter such that it loosely slips into a hole formed in the center of the carrier plate. The aforementioned protrusion 228 can be inserted into and withdrawn from the hole in carrier plate 7 by moving frame 222 in the direction of or opposite the direction of arrow a, as shown in FIG. 14. When inserting protrusion 228 into the hole of carrier plate 7, by means of vertical movement frame 224 and moving frame 222, it becomes possible to forward carrier plate 7 to containers 108, 110, 112 and also withdraw it from containers 108, 110, 112 as well.

Transport apparatus 104, which is constructed as explained above, operates and transports carrier plate 7 as described hereinafter.

Figure 15:
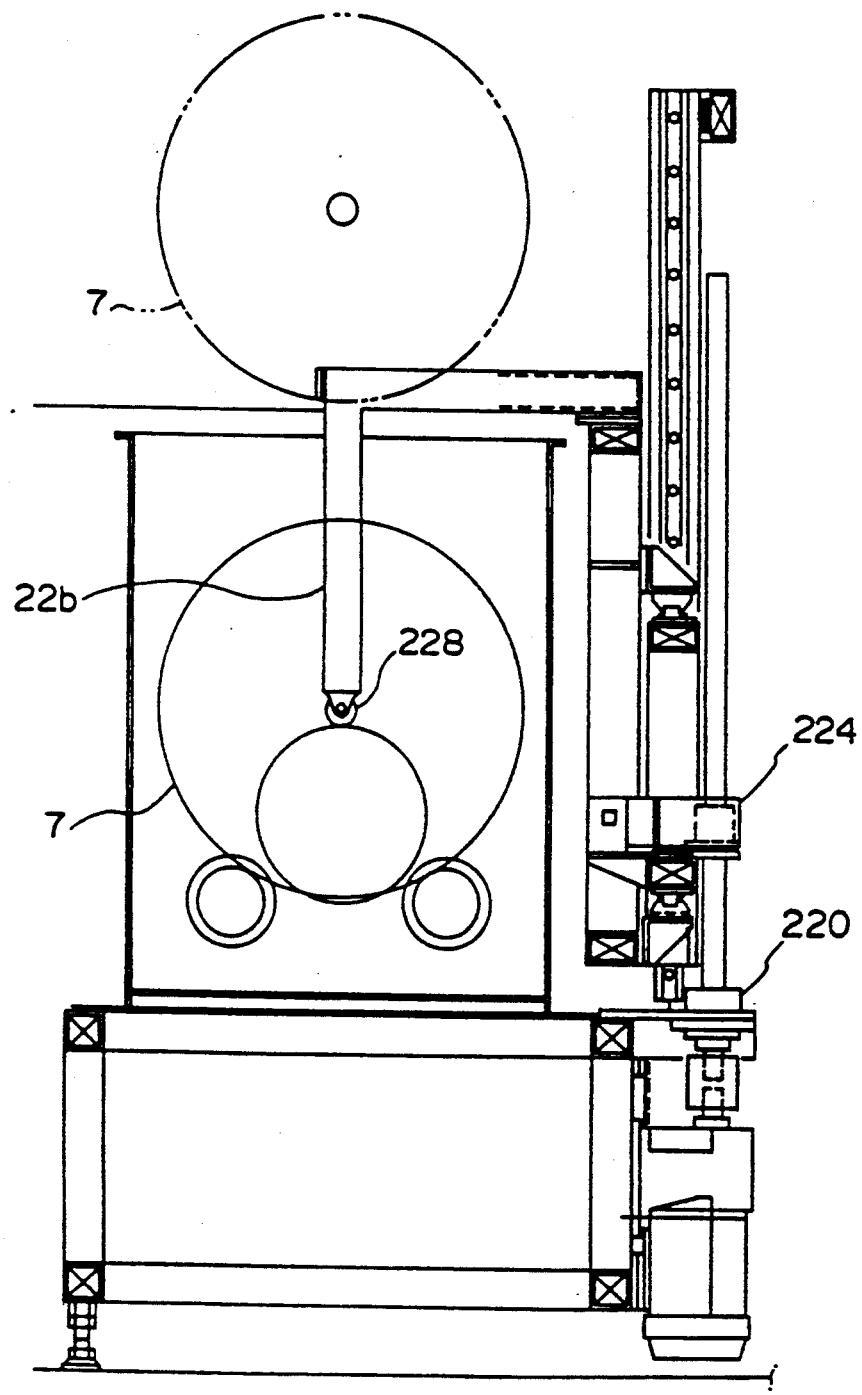
FIG. 15 is a plane view of the transport apparatus provided in the washing apparatus.

When carrier plate transport arm 226 is lifted under the condition as shown in FIG. 14, carrier plate 7 rises to the position as indicated by the dotted line in FIG. 15 from the position indicated by the solid line in FIG. 15 (position where it is soaked in the liquid of washing container 108). Under this rising condition, moving frame 222 is caused to move over the distance 12 in direction of arrow a, indicated in FIG. 14 and carrier plate 7, located at the very bottom in FIG. 14, is placed on washing container 108. Carrier plate 7 is then lifted up from washing container 108 (shown at the very bottom of FIG. 14) and is placed on washing container 110 (second washing container from the bottom indicated in FIG. 14), carrier plate 7 which is lifted up from washing container 200 is placed on washing container 112 (washing container shown on the very top in FIG. 14), and finally carrier plate 7, which is lifted up from washing container 112, is forwarded to the carrier plate receptor (explained in detail hereinafter) for the next process (spin drying apparatus 114).

In this position, when vertical movement frame 224 is lowered, all carrier plates 7 are placed into washing container 108, 110, 112 (carrier plate 7 is moved from the position indicated by the dotted line FIG. 15 to the position of the straight line). After vertical movement frame 224 has been lowered, and when moving frame 222 is moved slightly more than the dimension of protrusion 228, protrusion 228 is withdrawn from carrier plate 7. After having lifted vertical movement frame 224 at this condition, and when it is moved for a distance 12 is opposite direction of arrow a shown in FIG. 14, the preparation condition for the next transport action is completed. By repeating the aforementioned procedure, carrier plate 7 can be forwarded step by step between washing containers 108, 110, 112 in the direction of arrow a. When carrying out the transportation between washing containers 108, 110, 112 by such a procedure, no carrier plate 7 is left out, and accordingly, such things as re-adhesion of alien material cannot occur when drying.

Figure 16:
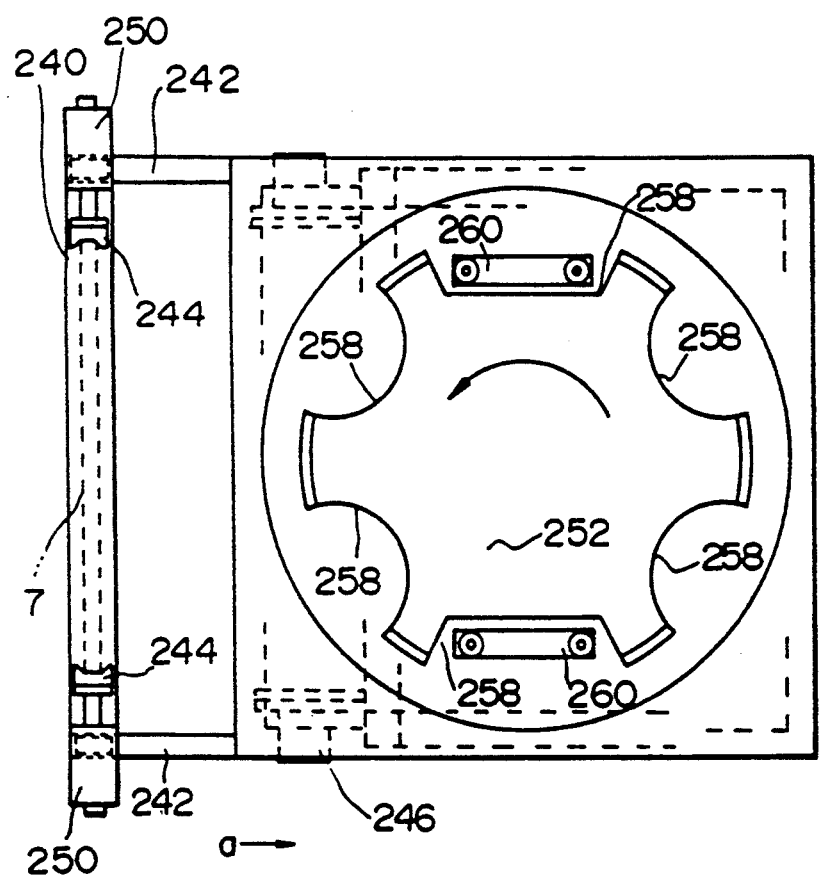
FIG. 16 is a plane view of the drying apparatus.

Hereinafter, an explanation on the spin drying apparatus 114 is given with references to FIGS. 16 and 17.

A carrier plate receptor 240, supported by a pair of arms 242, is provided. In the carrier plate receptor 240, carrier plate supporting members 244 are provided for supporting carrier plate 7. The aforementioned arms 242 can rotate in a vertical plane, around axis 246 by which they are supported and are driven by pneumatic cylinder 248. The aforementioned carrier plate supporting members 244 are each moved forward and backward by neumatic cylinder 250, and so can be moved in approaching or separating direction. Furthermore, carrier plate receptor 240 is positioned between supporting positions of carrier plates 7 in aforementioned washing container 112 at an interval equal to shift stroke 12 of transport means 104.

A turntable 252 is driven by motor 254 whereby the axis of the rotation is axis 256. The aforementioned turntable 252 is of plane shape as indicated in FIG. 16. In the position corresponding to the notch part 258 of turntable 252 vertical movement part 260 is provided. This vertical movement part 260, driven by pneumatic cylinder 262, passes notching part 258 of aforementioned turn table 252, and can move upward and downward as indicated in FIG. 17. Furthermore, transport means 116 and flap 264 are provided in the neighborhood of aforementioned spin drying apparatus 114. This flap 264, driven by pneumatic cylinder 230, is attached to the lower end of arm 268 which is supported such that it can rotate around axis 266.

Figure 18:
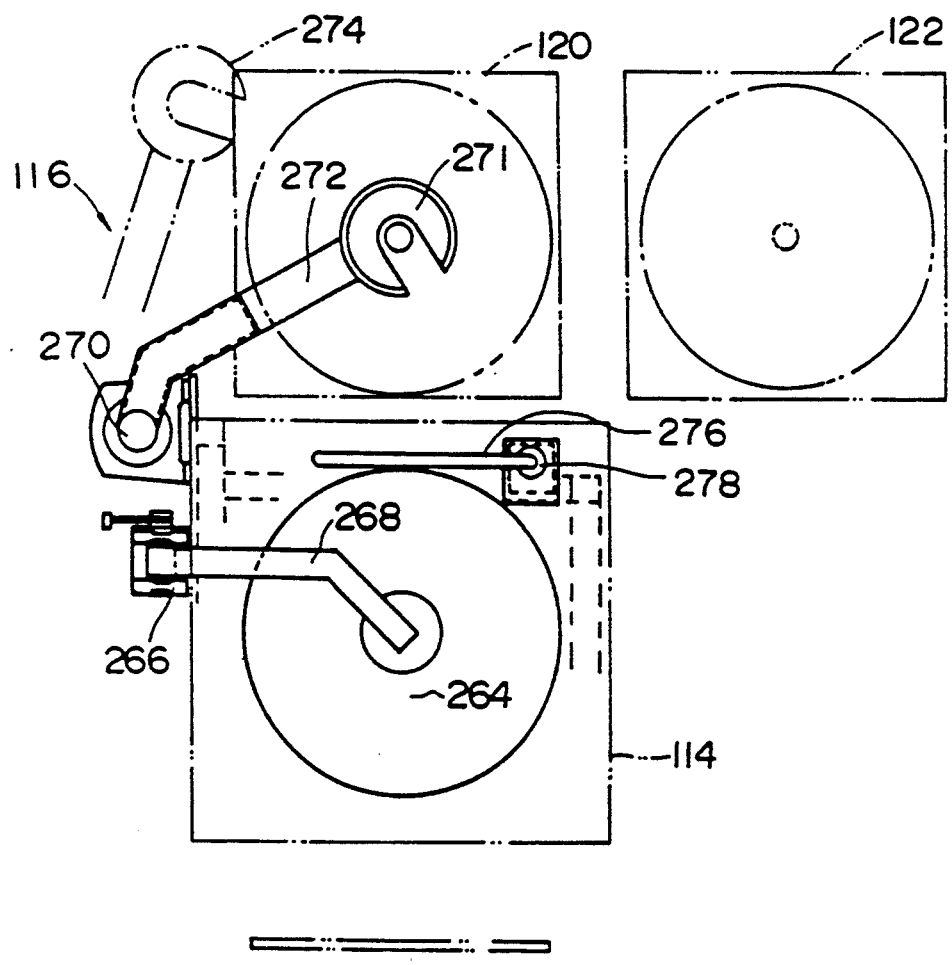
FIG. 18 is a plane view of the transport apparatus provided in the drying apparatus.

In transportation means 116, a disk 274 having a notch as indicated in FIG. 18 is provided at the lower end of arm 272 which rotates round axis 270.

There is a clear water supply pipe 276 supplying hot clear water according to the demand to the surface of carrier plate 7 on drying apparatus 114. This clear water supply pipe 276 can be moved to a position above turntable 252 and also be removed from this position by rotating it around axis 278.

The action of the above mentioned drying apparatus 114 is explained as follows:

1. Carrier plate 7 taken out of the third washing unit 112, belonging to washing apparatus 106, by transportation means 104, has been arranged at the upper parts of the carrier-plate support material parts 244 as shown in FIG. 17; moving along distance 12 of transportation means 104.

A pair of carrier plate support material parts 244 are prepared in a mutually separated condition. In this situation carrier plate 7 is inserted in a pair of carrier-plate support material parts 244, according to the items brought down by the transportation apparatus. Afterwards, when the carrier-plate support material parts 244 approach mutually, they are supported by carrier plate 7 inbetween.

Figure 17:
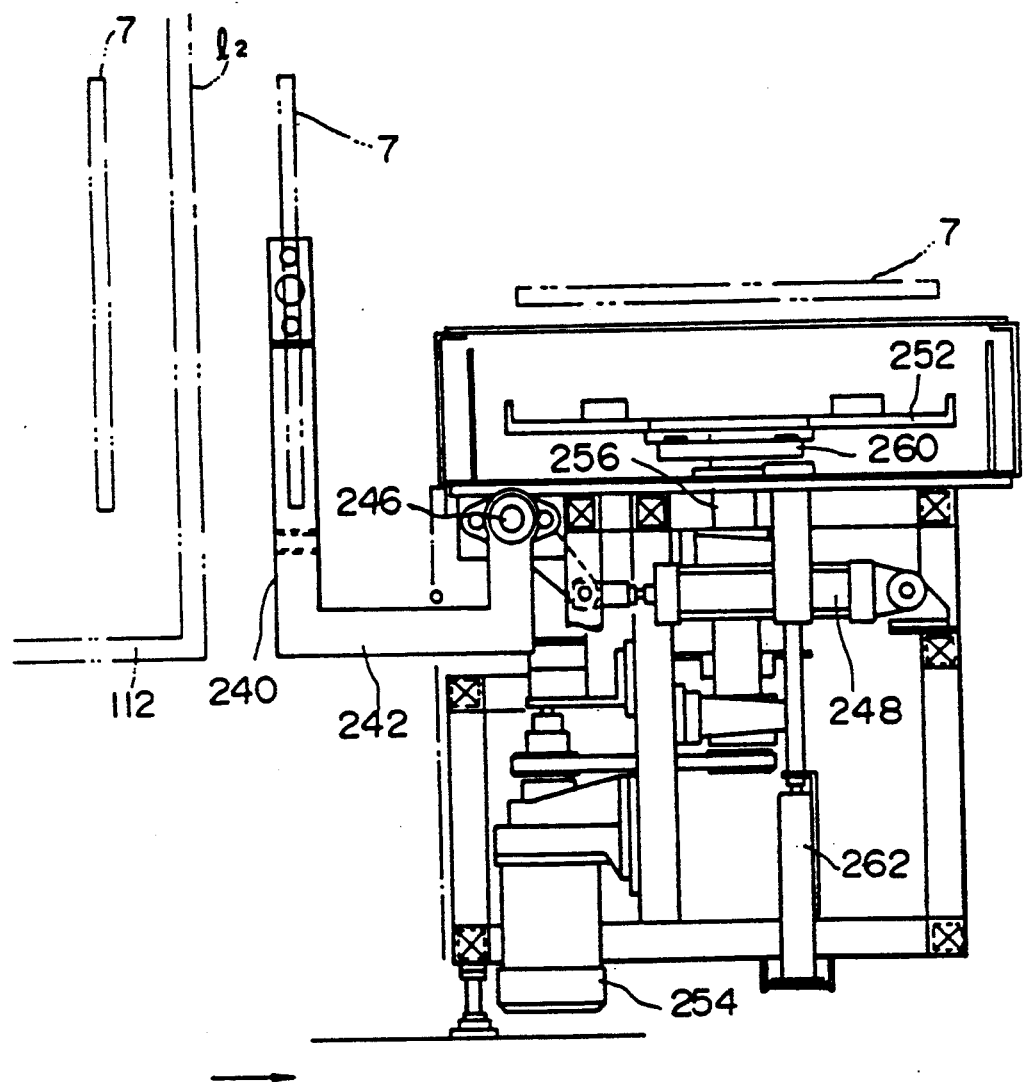
FIG. 17 is a front view of the drying apparatus.

2. when the pneumatic cylinder 248 is extended, arm 242 rotates clockwise as shown in FIG. 17, and carrier plate 7 is arranged horizontally in the upper part of turntable 252.

3. Ascending and descending parts 260 rise and support carrier plate 7 from beneath. Furthermore the carrier plate support material parts 244 separate from each other and carrier-plate 7 is placed on turntable 252.

4. The cleaning-pipe 276 rotates and is placed on the top of turntable 252; after supporting the cleaning process of the surface of carrier-plate 7, the cleaning-pipe 276 is returned to its initial position.

5. After lowering cover 264 to a position where there is only a short distance to the surface of carrier-plate 7, turntable 252 rotates for a fixed interval: drops of water on the surface of carrier-plate 7 are removed by centrifugal force. Moreover, along with the rotation of turntable 252, air is blown down onto the surface of carrier plate 7. Furthermore the rotation time of turntable 252 can be arbitrarily fixed by means of the timer (not shown in the figures) provided in the electric power supply circuitry of motor 254. Moreover, along with the rotation of turntable 252, the surface of carrier plate 7 is dried by air. Due to this drying air, the adherence of water drops, scattered around the periphery due to the centrifugation, to the carrier plate 7 is prevented. In addition, the expelled drying air is set up to the equal or higher temperature than that of the liquid used in the washing process (80° C.). In order to prevent the temperature fall of carrier plate 7 due to spin-drying.

Figure 19:
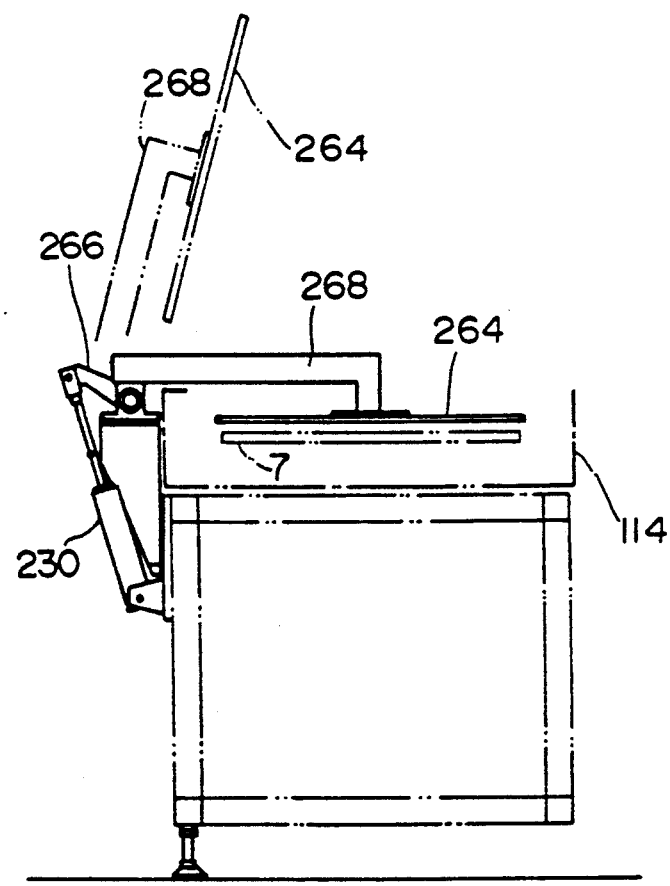
FIG. 19 is a front view of the transport apparatus provided in the drying apparatus.

6. When the rotation of turntable 252 as well as the expulsion of the drying air are completed, cover 264 rises up to the position indicated by the dotted line as shown in FIG. 19. Furthermore by means of the ascending and descending parts 260, carrier-plate 7 is lifted to a position above turntable 252.

7. Arm 272 rotates and is arranged into the same position as turntable 252. When the ascending and descending parts 260 are put down, carrier-plate 7 is placed on the tip of disk 274 of arm 272.

8. Arm 272 rotates and, as shown in FIG. 18, transports carrier-plate 7 to the top of the heating unit 120. After the completion of procedures 1 through 8, the process returns to the above mentioned procedure 1 and the spin drying disposal of the next carrier-plate 7 begins.

Next, heating apparatus 118 as well as transportation means 126 will be explained in relation to FIGS. 20 through 24.

Figure 21:
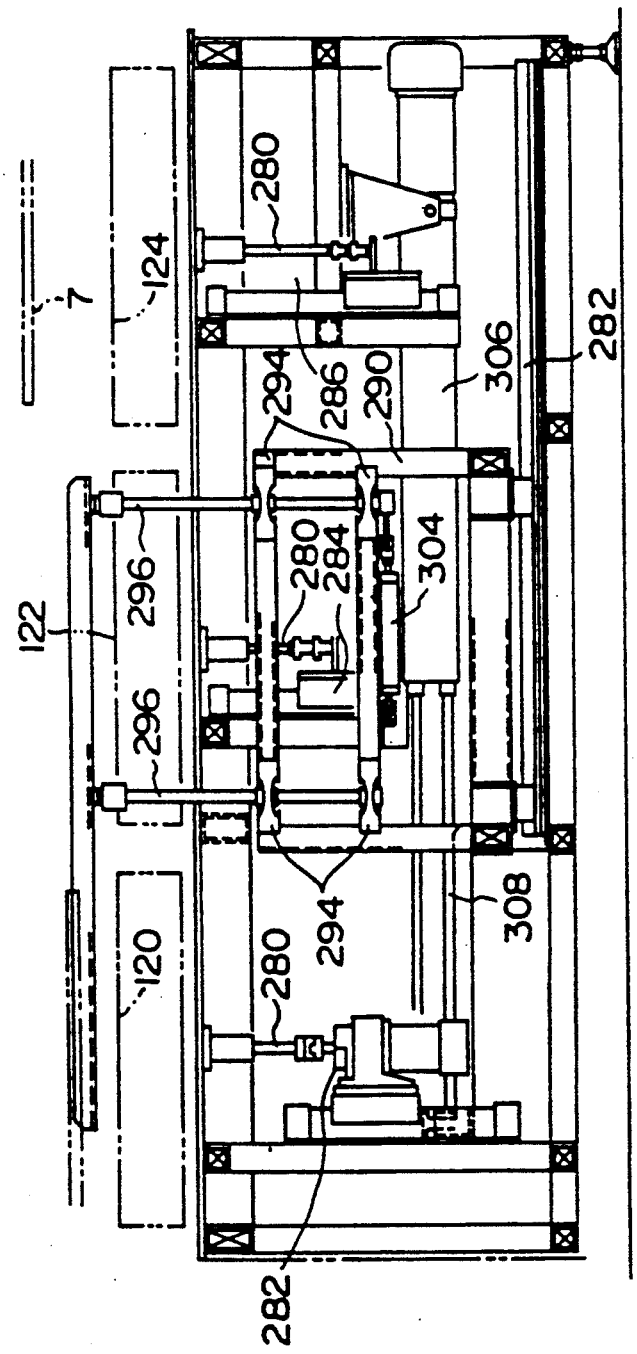
FIG. 21 is a side view of the heating apparatus.
Figure 22:
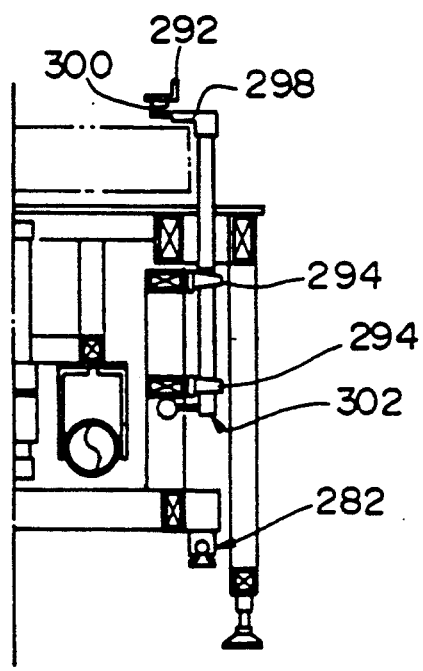
FIG. 22 is a cross section of the transport apparatus provided in the heating apparatus.
Figure 23:
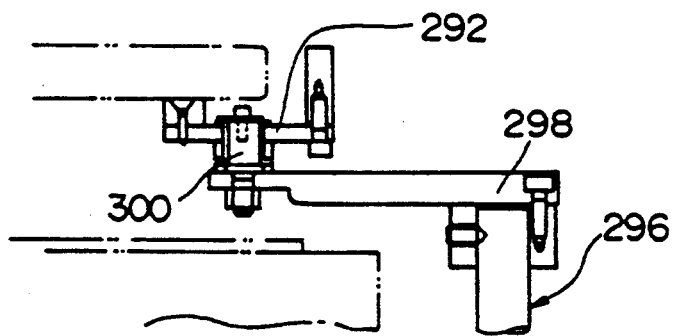
FIG. 23 is a cross section view of the main part of the transportation apparatus from FIG. 22.
Figure 24:
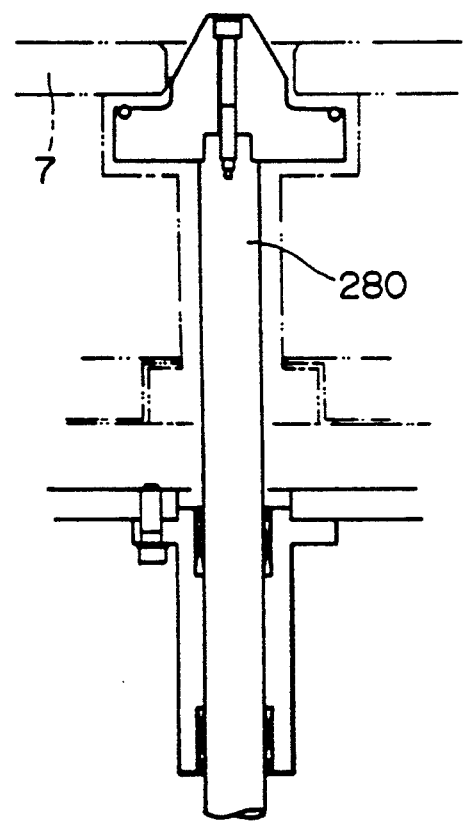
FIG. 24 is a cross section view of the axial part of the heating apparatus.

The heating units 120 through 124, which comprise heating apparatus 118, are mutually installed in the space 13. Due to the electric heating by heating units 120 through 124 of the disk upon which carrier-plate 7 rests, the temperature of carrier-plate 7 gradually increases from room temperature to a temperature appropriate for bonding. Furthermore an axle 280 is provided in the center of respective heating units 120 through 124 as shown in FIG. 24. The tip of this axle 280 is inserted in the center of carrier-plate 7 which rests on top of heating units 120 through 124. The above mentioned axle 280 is moved up and down, as shown in FIG. 21, driven by means of pneumatic cylinders 282 through 286 which respond to the heating units 120 through 124. Due to the rising of axle 280, carrier-plate 7, supported by axle 280, is then lifted up above the surface of heating units 120 through 124. Axle 280 descends and carrier-plate 7 comes into contact with heating units 120 through 124.

A set of tracks 288 which make up the transportation frame are provided on both sides of heating apparatus 118. Transportation frame 290 is supported by transportation members 292, which transport carrier-plate 7, lying on top of heating units 120 through 124, over the intervals between the respective heating units.

The mechanism of the aforementioned transportation members 292 is constructed as follows:

For transportation frame 290 two pairs of bearings 294 are set up, which exert an influence on the support of a pair of axles 296. At the tip of each axle 296, crank arms 298 are installed respectively. At the tip of these crank arms 298, the above mentioned transportation members 292 are connected in a way that rotation is possible with axle 300 as the center. Furthermore crank arm 302 is arranged on one basic side of axle 296. Crank arm 302 is connected to pneumatic cylinder 304. The contraction and expansion of pneumatic cylinder 304 allows axle 296 to rotate. Due to this contraction and expansion, the aforementioned pair of transportation frames 290 approach to a position where they can pile up with carrier-plate 7 or where they can detach from it. Moreover, due to the contraction and expansion of rod 308 of power-cylinder 306, the movement to the left and right ranging to space 13 is made possible.

Next, the transportational movement of carrier-plate 7 by transportation means 126 will be explained below.

1. When receiving carrier-plate 7, the transportation members 292 are in a mutually separated condition and axle 280 is lowered and ready for further movements.

2. When carrier-plate 7 is transported to the top of heating units 120, due to the rotation of arm 272, axle 280 rises and carrier-plate 7 is inserted so that it is supported by axle 280.

3. when axle 280 is lowered, carrier-plate 7 is placed on top of heating units 120 through 124 and heated.

4. when carrier-plate 7 is heated to a predetermined temperature by respective heating units 120 through 124, axle 280 rises and lifts each respective carrier-plate 7. Due to the rise of axle 280 the underside of each carrier-plate 7 is set up to a higher position than the surface of transportation members 292.

Figure 20:
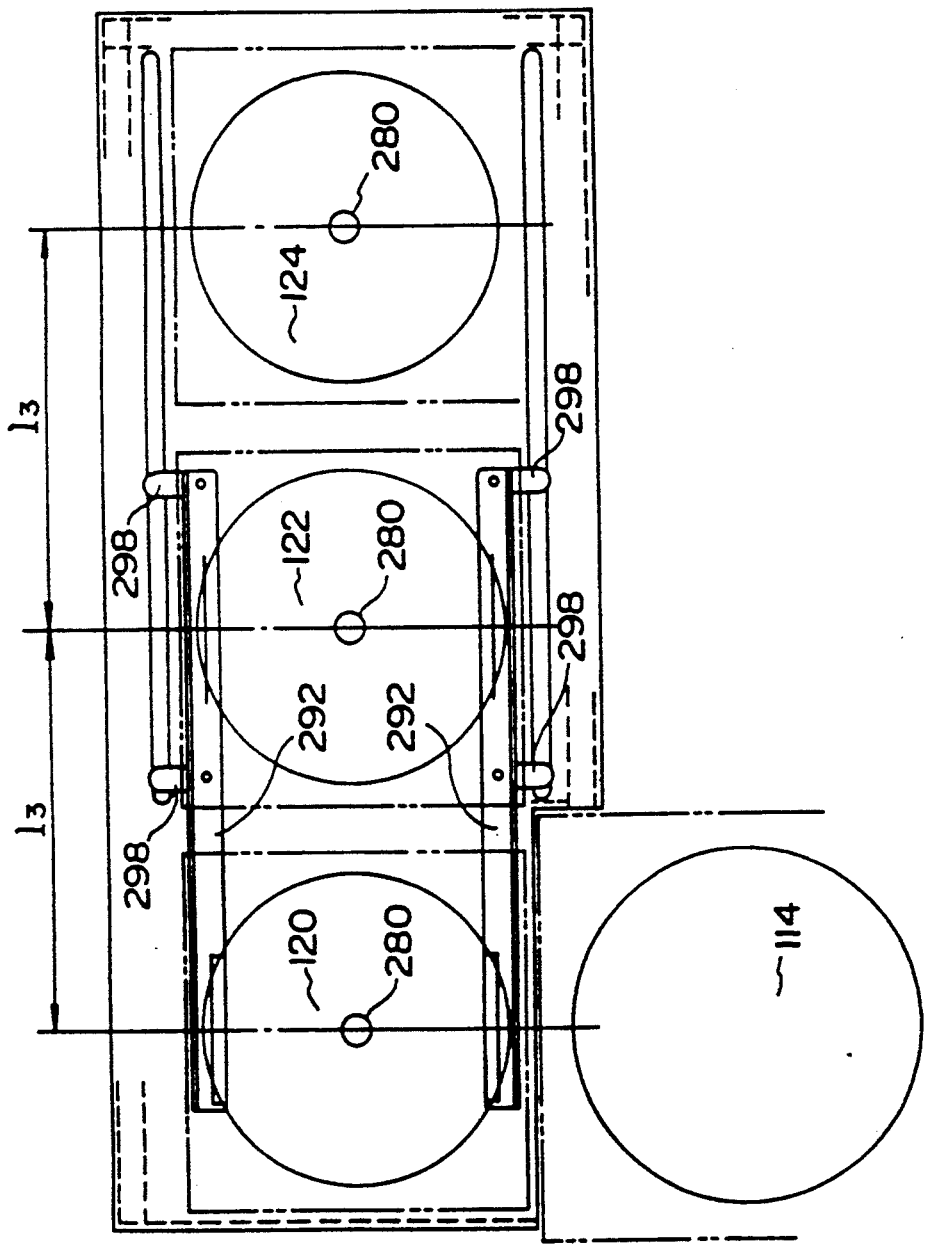
FIG. 20 is a plane view of the heating apparatus.

5. The transportation members 292 approach each other reciprocally and, as shown in FIG. 20, are arranged at a level position on the outer periphery of each carrier-plate 7.

6. When one of the axles 280 descends, a carrier-plate 7 on top of one of the respective heating units 120-124 is supported by the respective transportation members 292.

7. When rod 308 of power-cylinder 306 contracts, transportation frame 290 crosses space 13 and carrier-plate 7 on top of heating part 120 moves to the top of heating part 122; while carrier-plate 7 on top of heating part 122 moves respectively to the top of heating part 124.

8. When one of the axles 280 rises, carrier-plate 7 is taken up. In addition, the transportation members 292 become mutually separated.

Similar to the three processes mentioned above, with the lowering of each axle 280, a carrier-plate 7 is placed on top of one of respective heating units 120-124, the carrier plate 280 is heated, and the aforementioned process is repeated.

The aforementioned axle 280, provided in the final heating unit 124, in addition to accompanying the carrier movement of the aforementioned carrier plate 7, is employed in adjusting the temperature of the carrier plate 7. For example when the carrier plate 7 is placed on the top of this final heating unit 124 for a long period of time, depending on the reason for stagnation, etc. of the binding process occurring within the binding unit 128, the temperature will rise to an excess. In order to prevent this kind of temperature rising, the heating unit 124 can adjust its own temperature according to its heat capacity, but in this case the production of a time lag in the temperature control cannot be avoided. In this example, according to the rising of the axle 280 provided in the heating unit 124, the carrier plate 7 can be lifted from the heating unit 124. Namely, when the carrier plate 7 is superheated, the temperature of the carrier plate 7 can be controlled by means of controlling of the rising of the axis 280.

With the aforementioned binding unit 128 as the center, a cooling apparatus 160 is provided at a location symmetrical to the position of the heating apparatus 118. Cooling units 162-166 disclosed in this cooling apparatus have a similar organization to the heating units 120-124. Each of the cooling units 162-166 is designed in a manner such that the temperature is gradually lowered according to the flow of the heating medium in the interior of the unit. In this way, the carrier plate 7 placed on top of this unit is gradually cooled from binding temperature to room temperature. Additionally, on the side of the cooling apparatus a carrier means 126 is provided which, in the same manner as the aforementioned heating apparatus, conveys the carrier plate 7 over the distance 13 between each cooling unit 162-166. Furthermore, an imprinting machine 310 is provided for attaching an identification mark to the carrier plate 7.

Figure 25:
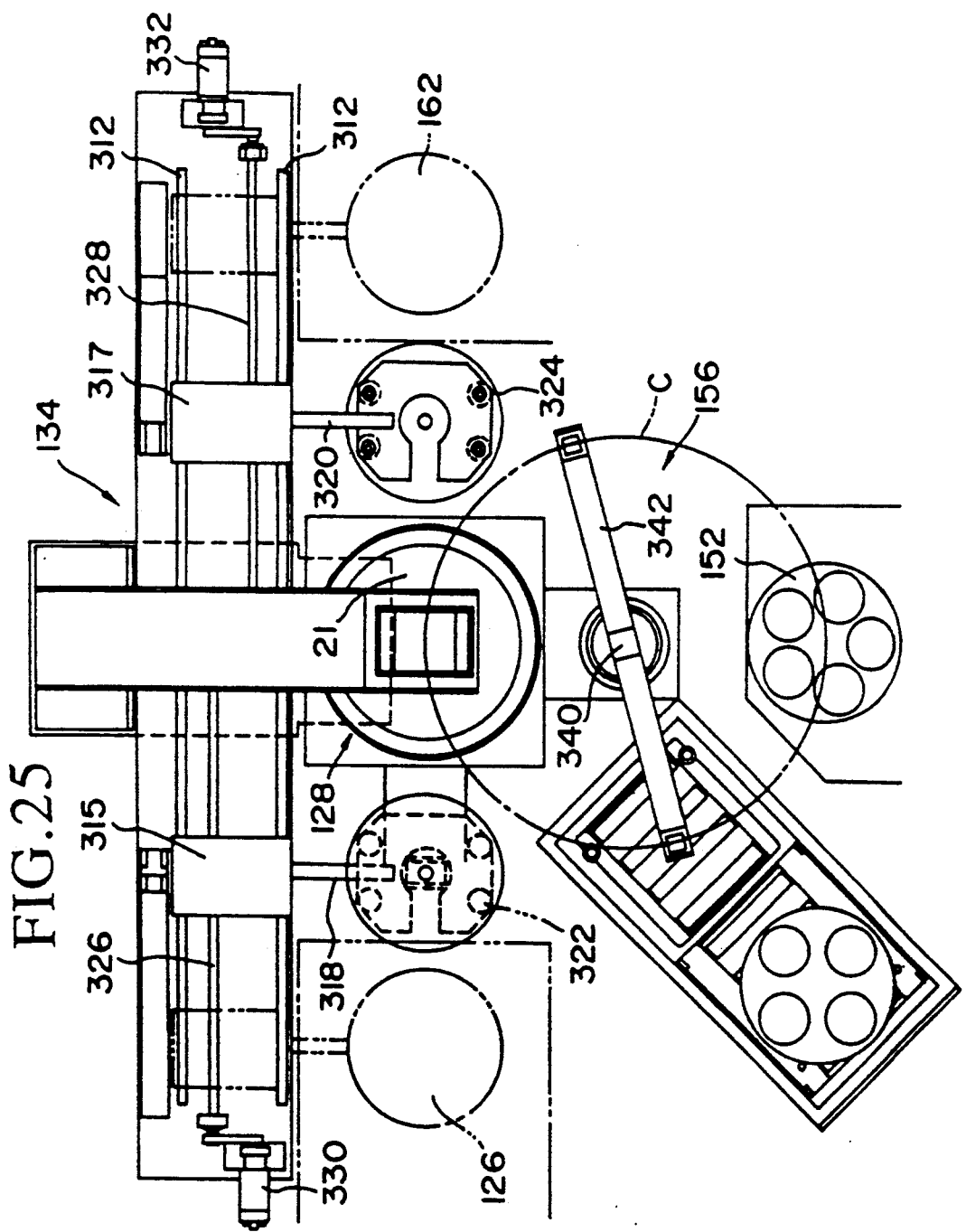
FIG. 25 is a plane view showing the layout of the binding unit and its surrounding apparatus.
Figure 26:
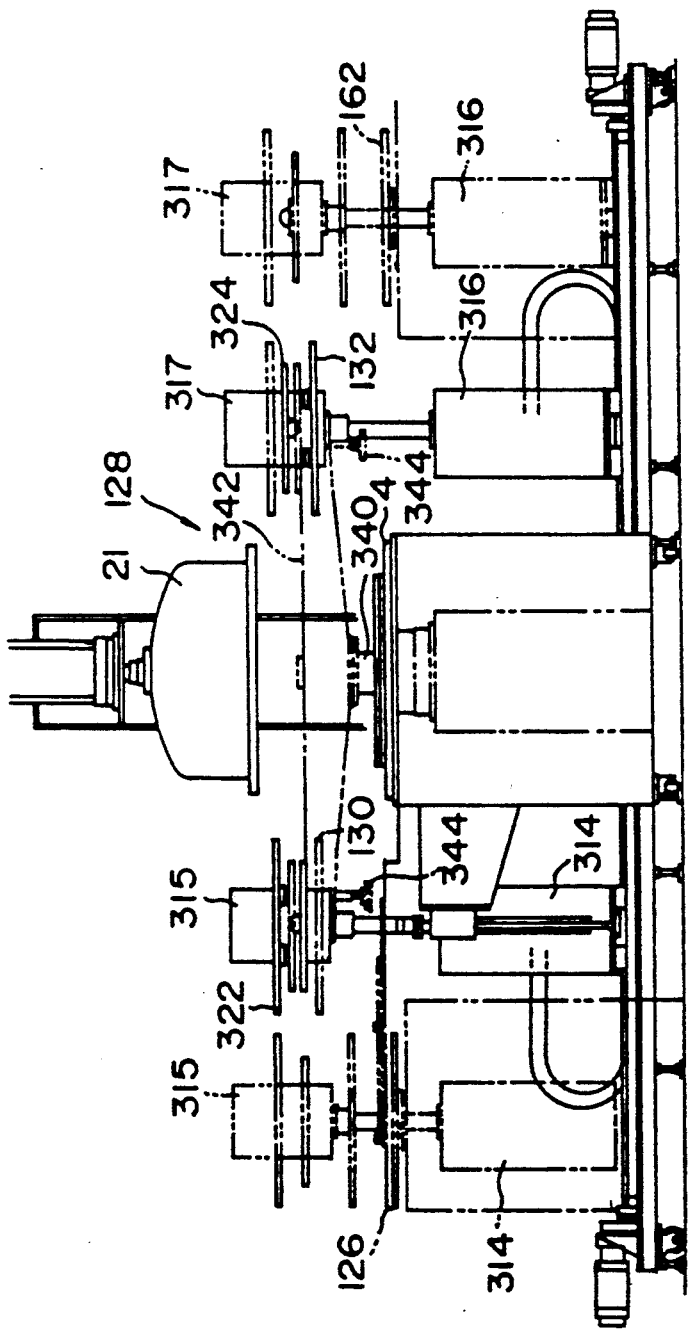
FIG. 26 is a front view of the parts shown in FIG. 25.
Figure 27:
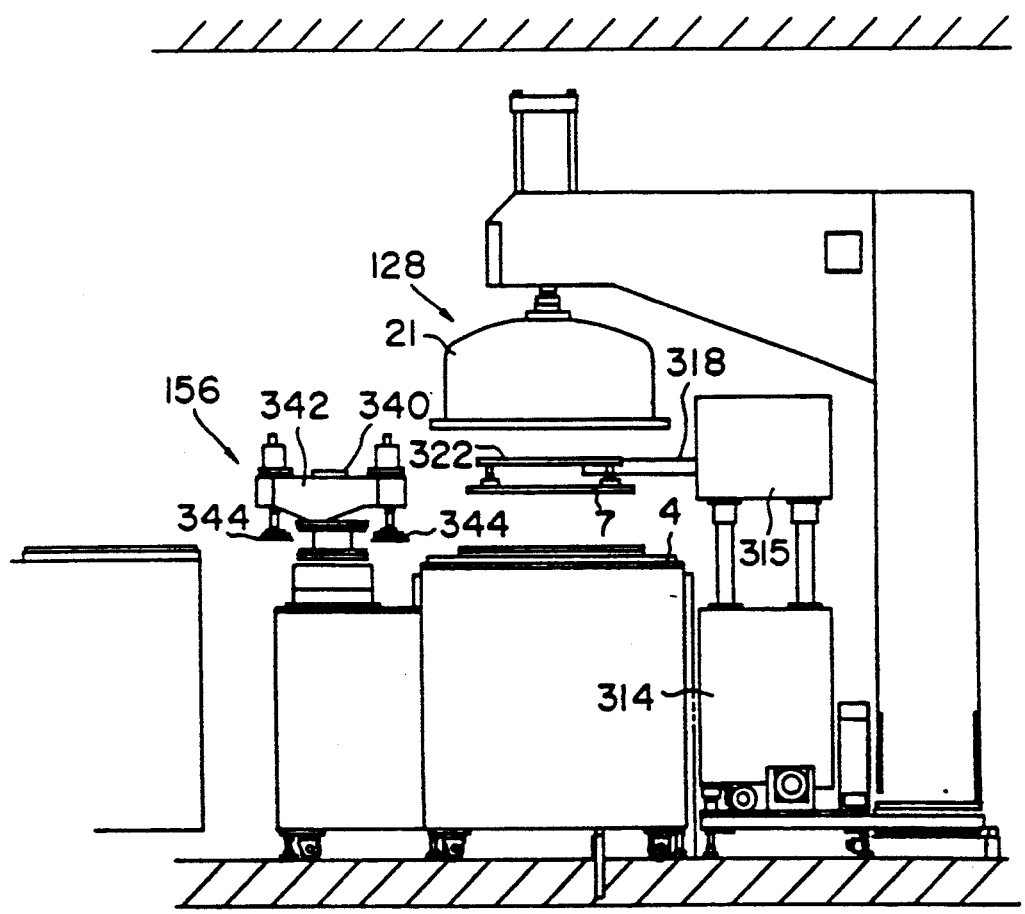
FIG. 27 is a side view of the parts shown in FIG. 25.

In the following, the binding unit 128 and the carrier plate transportation machine 134 will be explained with reference to FIGS. 25 through 27.

This carrier plate transportation machine 134 conveys the carrier plate 7 along the direction of the aforementioned heating apparatus 118, binding unit 128 and cooling apparatus 160. On top of a railway 312 are provided first and second moving frames 314, 316 respectively. In each of these moving frames 314, 316 first and second vertical movement frames 315, 317 are provided. In each of these vertical movement frames 315, 317 arms 318, 320 capable of rotation are provided. At the edges of these arms 318, 320 are provided first and second adhesive means 322, 324 which are inserted into the lower parts of the carrier plates 7 and thus adhere to the lower surface. In addition, the aforementioned moving frames 314, 316 run along the lines of the previously mentioned railway and are able to move in both left and right directions, in both FIGS. 25 and 26, through the rotating of provided first and second feed screws 326, 328 by each respective driving motor 330, 332.

Organized in the above mentioned manner, the carrier plate transportation machine 134, through first adhesive means 322, adheres to the carrier plate 7 which has been transported as far as heating unit 124 of the heating apparatus 118. The carrier plate 7 is turned about in accordance with the rotating of axle 318. After the prepared binding surface is turned downward, the carrier plate 7 can be placed on top of the pedestal of the binding means 128.

Additionally, the carrier plate 7 bonded to the wafer, is bonded and lifted up from the top of pedestal 4 by means of second adhesive apparatus 324. According to the rotation of axle 320, the carrier plate 7 is turned about and once the prepared binding surface is turned downward, the carrier plate 7 can be placed on top of the pedestal of binding means 128.

Figure 28:
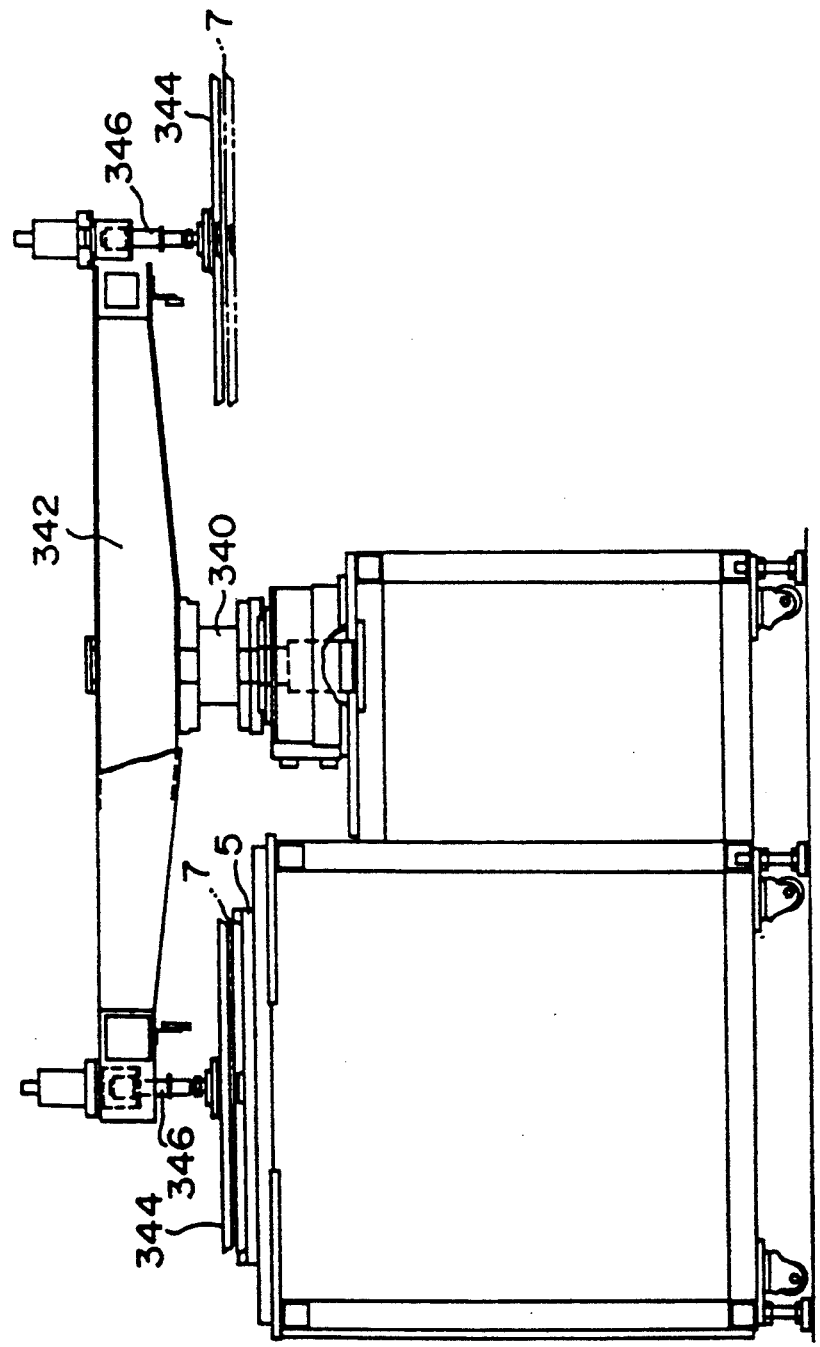
FIG. 28 is a side view of the wafer transportation machine.

The aforementioned wafer transportation machine 156, as shown in FIG. 28, is designed so that the adhesive means, provided at both ends of the rotating arm 342 with axle 340 as the center, is capable of moving both upward and downward respectively by means of the pneumatic cylinder 346. Additionally, the aforementioned pedestal 4, wafer setting apparatus 152 and wafer carrier holder 154 are arranged along the lines of the arc of the rotating locus of the aforementioned arm 342 (as shown in part C of FIG. 8). Therefore, by means of the aforementioned arm 342 and the up and down movement as well as the repetition of the adhesive opening of the adhesive means 344, the carrier plate 7 can be transported over the distance between pedestal 4, wafer setting apparatus 152 and wafer carrier holder 154.

The aforementioned wafer carrier holder 154 is designed in a manner such that a large number of rollers 352 are provided on top of the supporting body 350 maintaining wafer carrier 5. The wafer carrier 5, by means of these rollers 352, is able to transport inside and outside of the moving range of the aforementioned arm 342. Furthermore, a a driving force apparatus has been placed inside of a portion of the above mentioned roller 352 (figure not included), thus the roller is able to rotate by itself. The other rollers 352 are designed to rotate according to the movement of the wafer carrier 5.

In the following, the organization of the line supplying the wafer 6 to the wafer setting apparatus 152 will be explained.

In this line the wafer is supplied in each batch using a previously established system according to the data results obtained for such qualities as thickness, etc. Additionally, in this line, the wafer surface with the CVD (Chemical Vapor Deposition) coating is turned facing upward, and the wafer 6 is then transported.

Figure 29:
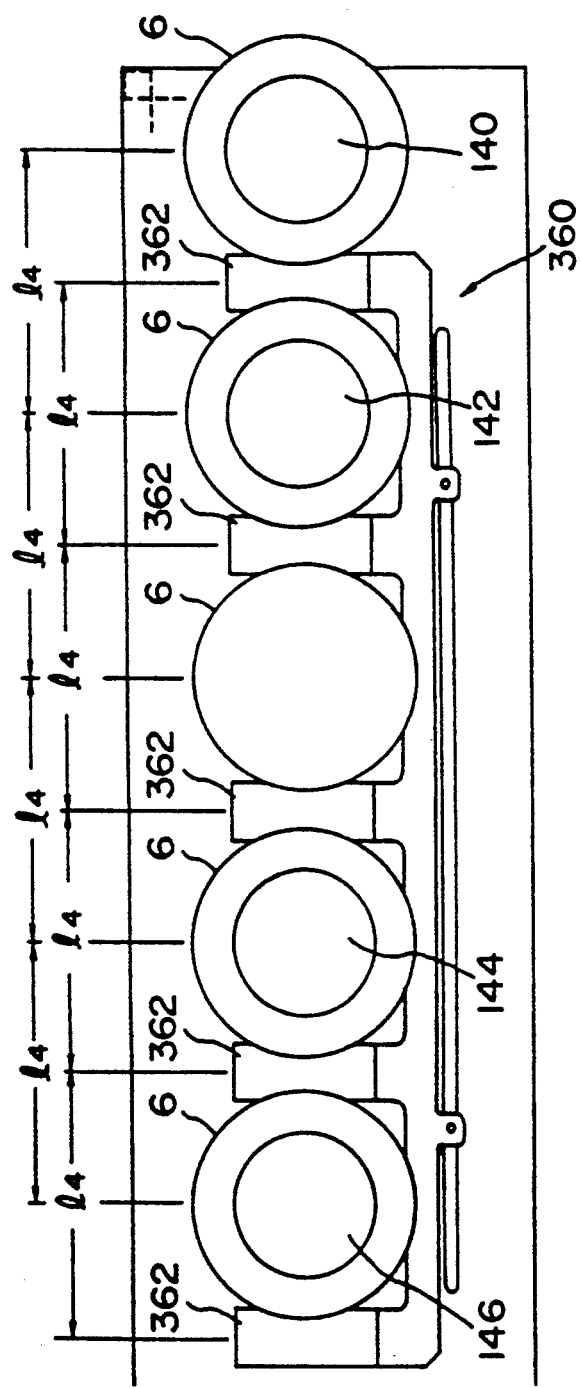
FIG. 29 is a plane view of the working beam.
Figure 30:
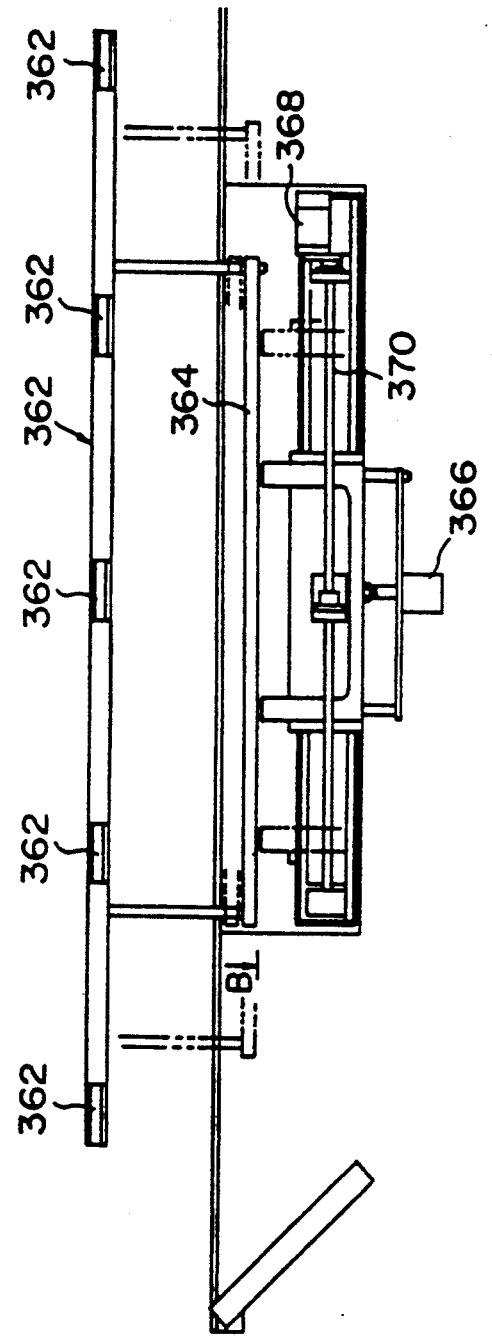
FIG. 30 is a side view of the working beam.

The movement of the wafer 6 over the intervals between centering apparatus 140, cleaning apparatus 142, wax coater 144, hot baking apparatus 146 and OF position alignment apparatus 148 is carried by means of the working beam 360, shown in FIGS. 29 and 30.

Working beam 360 has a plurality of support plates 362, as shown in FIG. 29. In the intervals between the support plates 362, arrangement spaces 14 and equivalent spaces 14 for centering apparatus 140, washing apparatus 142, wax coater 144, hot baking apparatus 146, and OF position alignment apparatus 148 are provided. The connecting units of the wafers 6 on top of these apparatuses are designed so that they can be lifted from the lower base parts. The aforementioned working beam 360 is supported by a vertical movement frame 364 through which upward and downward motion is possible, and is driven upward and downward by means of an pneumatic cylinder 366. Additionally, the aforementioned vertical movement frame 364 is supported such that movement in both the left and right directions in FIG. 8 is possible. As well, this vertical movement frame 364 is moved right and left by means of a feed screw 370 driven by a motor 368.

Figure 31:
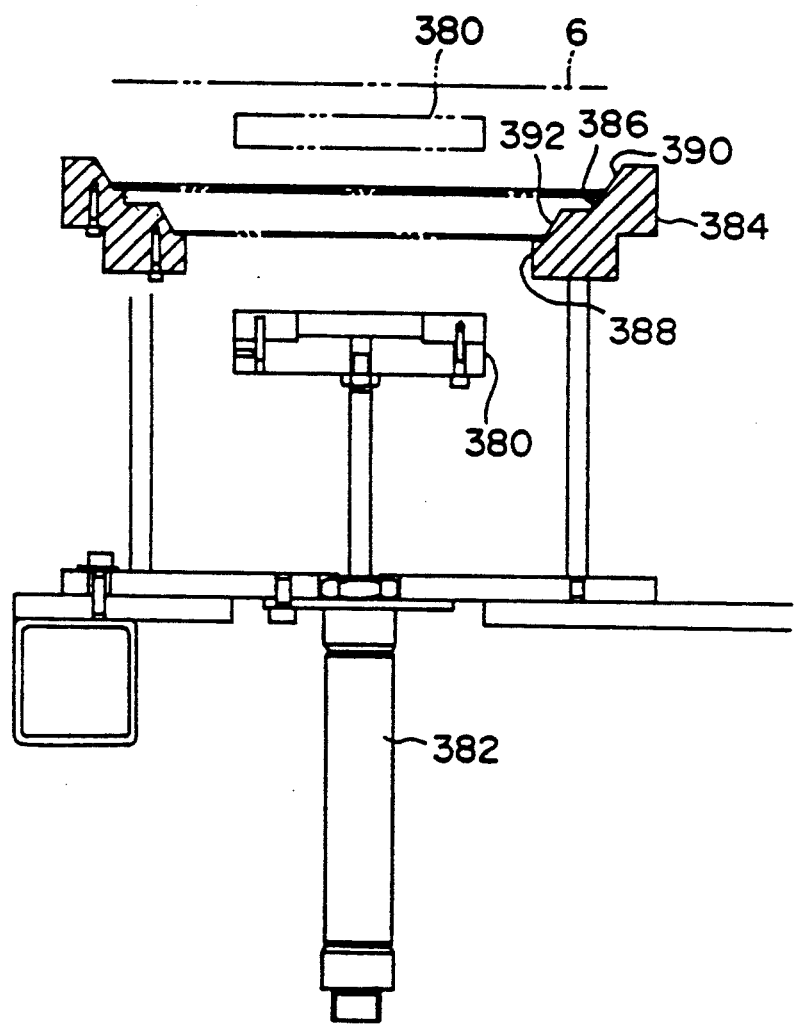
FIG. 31 is a cross section view of the centering apparatus.

The centering apparatus is shown in FIG. 31. The vertical movement body 380 moves upward and downward by means of the pneumatic cylinder 382 and in this way the vertical up and down moving of a wafer 6 placed on top of this body is possible. In a position alignment plate 384, there are provided a first step 386 and a second step 388. According to a standard wafer to be treated by this centering apparatus, these steps 386 and 388 are fixed to the dimensions of the wafer's inner diameter, slightly smaller than the outer diameter. Additionally, at the upper parts of these aforementioned steps 386, 388 tapered portions 390, 392 are provided in order to guide the wafer to these steps. In this centering apparatus, the wafer is received when the vertical movement body 380 is in the elevated position. Following this, the wafer is guided to step 386 or 388 by the either of the aforementioned tapered parts 390, 392 according to the descent of the vertical movement body 380. The positioning of the wafer is determined according to the following cleaning apparatus and wax coater.

Figure 32:
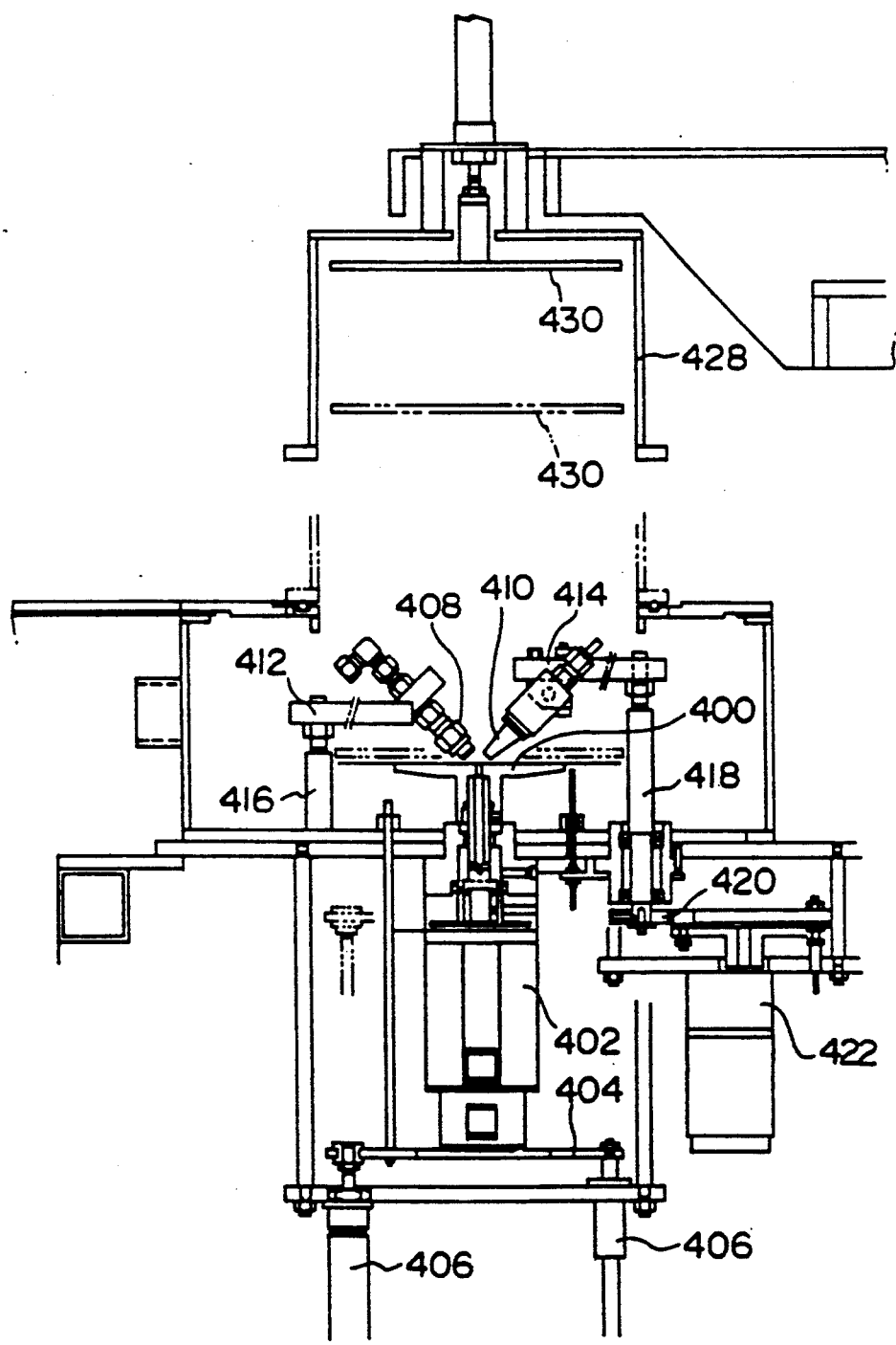
FIG. 32 is a cross section view of the washing apparatus.

In the following, the washing apparatus will be described according to FIG. 32. In the figure a turn table 400 is provided which is designed to rotate, driven by the motor 402. The aforementioned turn table 400 and motor 402 are supported by a vertical movement frame 404. This vertical movement frame 404 is supported such that it freely moves upward and downward and is driven by means of an pneumatic cylinder 406.

At the upper part of this turn table 400 are provided two nozzles: the first nozzle 408 shoots the washing liquid out onto the wafer 6 at a high pressure, while the second nozzle 410 adds ultrasound wave energy to the washing liquid and blows it against the wafer 6. First nozzle 408 and second nozzle 410 are supported by free rotating arms 412 and 414. The aforementioned arms 412, 414 are supported by axles 416, 418 as the centers such that the arms are capable of rotation. The pulley 420, provided at the lower portions of the aforementioned axles 416, 418, is driven by a motor such that the cleaning liquid can be blown out over a wide range. However, the axle 416, driven by the motor, as well as the pulley are not shown in the figures. The circumference of the above mentioned turn table 400 is enclosed by a lower portion cover. The suction piping 426, connected to the lower portion cover 424, is designed to remove air and drops of water inside of the lower portion cover. At the upper part of the aforementioned lower portion cover 424, an upper portion cover 428 and an upper lid 430 are provided. During the washing of the wafer 6, this upper portion cover 428 is in a lowered state, in order to prevent the scattering of water drops and dust particles. In addition, during the cleaning of the wafer 6, the upper lid 430 is brought to the raised position in order to avoid the adhesion of the cleaning liquid spray.

In this cleaning apparatus, first and second nozzles 408, 410 each rotate together with the turn table 400: during rotation, these nozzles jet out washing liquid onto the wafer 6 which lies on top of the turn table. The washing liquid is jetted out from the first nozzle 408 at a flow rate of 0.5-2.0 liters/minute under a pressure of 100-300 kg/cm$^2$. The high pressure of the washing liquid mainly removes materials which are loosely attached to the surface of the wafer. If the pressure of the washing liquid propelled out of first nozzle 408 is below a minimum fixed value, the washing is insufficient, however if a maximum fixed value is exceeded, then damage is inflicted to the surface of the wafer. The washing liquid furnished with 500-1000 KHz wave oscillations is jetted out of second nozzle 410 at a flow rate of 0.5-3.0 liters/minute. Additionally, it is enough that the pressure of the washing liquid jetted out of second nozzle 410 is sufficiently less than that of the first nozzle 408. This washing liquid furnished with the high frequency oscillation energy removes fine particles on the surface of the wafer. The washing liquid supplied from second nozzle 410, through the employment of high frequency oscillation energy, has a high washing ability, thus the pressure of the washing liquid jetted out of first nozzle 408 may be comparatively small such that there is very little chance of damage to the wafer surface by this pressure. A fear of damaging the wafer surface exists if the period of the wave oscillations added to the aforementioned washing liquid is lower than a minimum fixed value; however, when a maximum fixed value is exceeded, the oscillations are reduced, and detergency is lost.

After the supplying of the aforementioned washing liquid is ceased, the turn table 400 continues rotating. At the same time as the removal of the washing liquid from the wafer surface, the upper lid 430 is lowered to the wafer surface, and the wafer surface is dried by blowing inert gas against it.

Between the aforementioned washing apparatus 142 and the wax coater 144, a space that is two times the normal space 2×14 is provided. Consequently, in the washing apparatus once the washed wafer 6 has been placed into the space between the washing apparatus 142 and the wax coater 144, the wax coater is ushered in.

Figure 33:
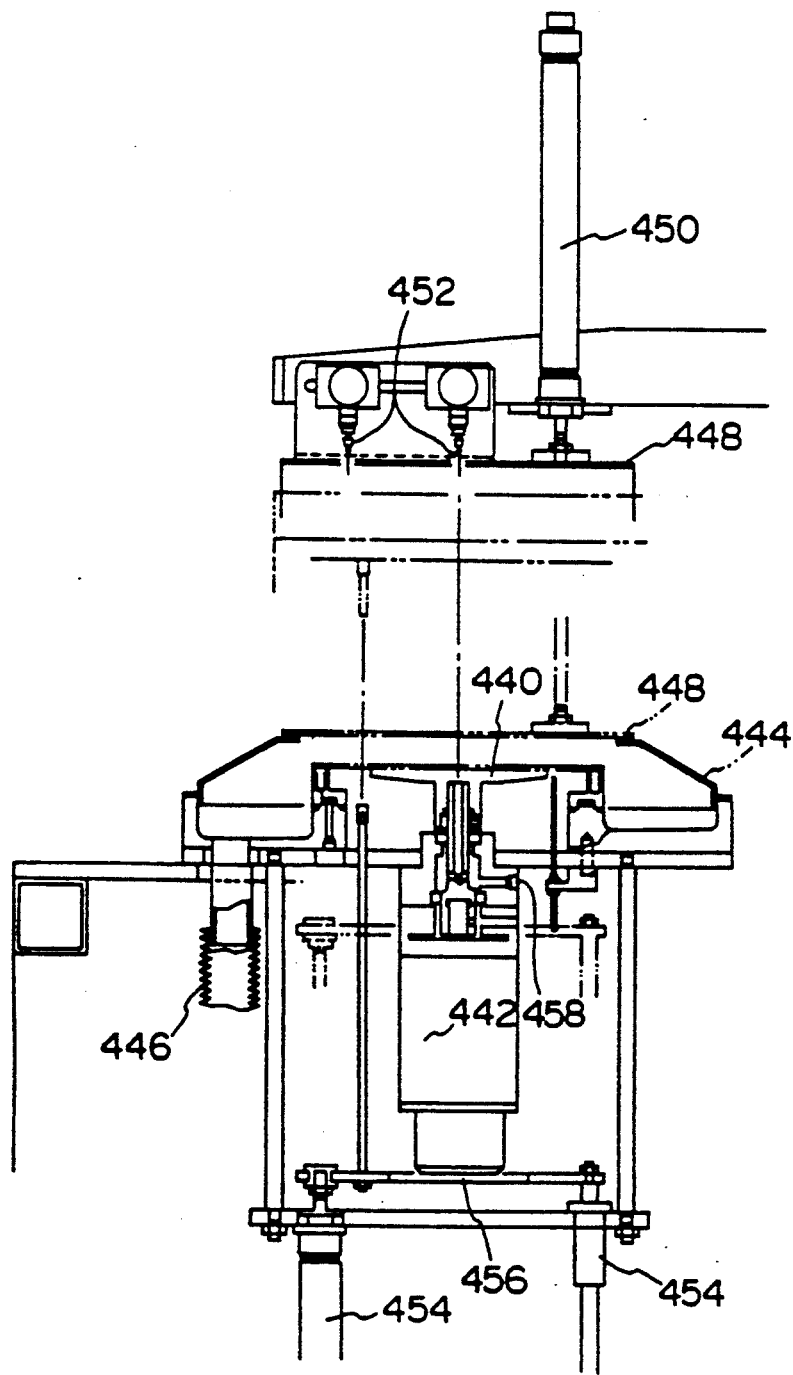
FIG. 33 is a cross section view of the wax coater.

The wax coater 144 will now be explained using FIG. 33.

In the figure, turn table 440 rotates, driven by means of a motor 442. A cover 444 is provided around the circumference of the turn table 440. Connected to this cover 444 is a suction duct, which is designed to remove by suction such things as air from the inside of the cover.

A lid 448 is provided above the aforementioned turn table 440. This lid 448 is either supported by the pneumatic cylinder 450 in the upraised position shown in the figure, or can be moved into the lowered position covering the upper opening of the aforementioned cover 444. Additionally, on the aforementioned lid 448, two wax supply nozzles are provided. These wax supply nozzles 452 are designed to supply wax to the surface of the wafer 6 which lies on top of the aforementioned turn table 440. Furthermore, the above mentioned motor 442 moves upward and downward by means of the pneumatic cylinder 454, and is supported by the vertical movement frame 456: this motor 442 is designed so that it is capable of moving upward and downward together with the aforementioned time table 440. In the aforementioned turn table 440 is provided an end connection 458, connected to the vacuum source (not shown in the figures). By employing this vacuum source, supplied from the end connection, on the upper surface of the turn table 440, the wafer 6 is glued to the upper surface of the turn table 440.

The aforementioned not baking apparatus 146 supports the wafer 6 which lies on top of the vertically mobile table: through the heating of this above mentioned table, the organic solvents inside of the wax are removed.

The wafer 6 processed by both the wax coater 144 and hot baking apparatus 146 is guided to the OF position alignment apparatus 148 by means of the working beam 360. Using carrier means 150, the wafer is further guided to the wafer setting apparatus. In the following, each of the above mentioned apparatuses will be described with reference to FIGS. 34 and 35.

Figure 34:
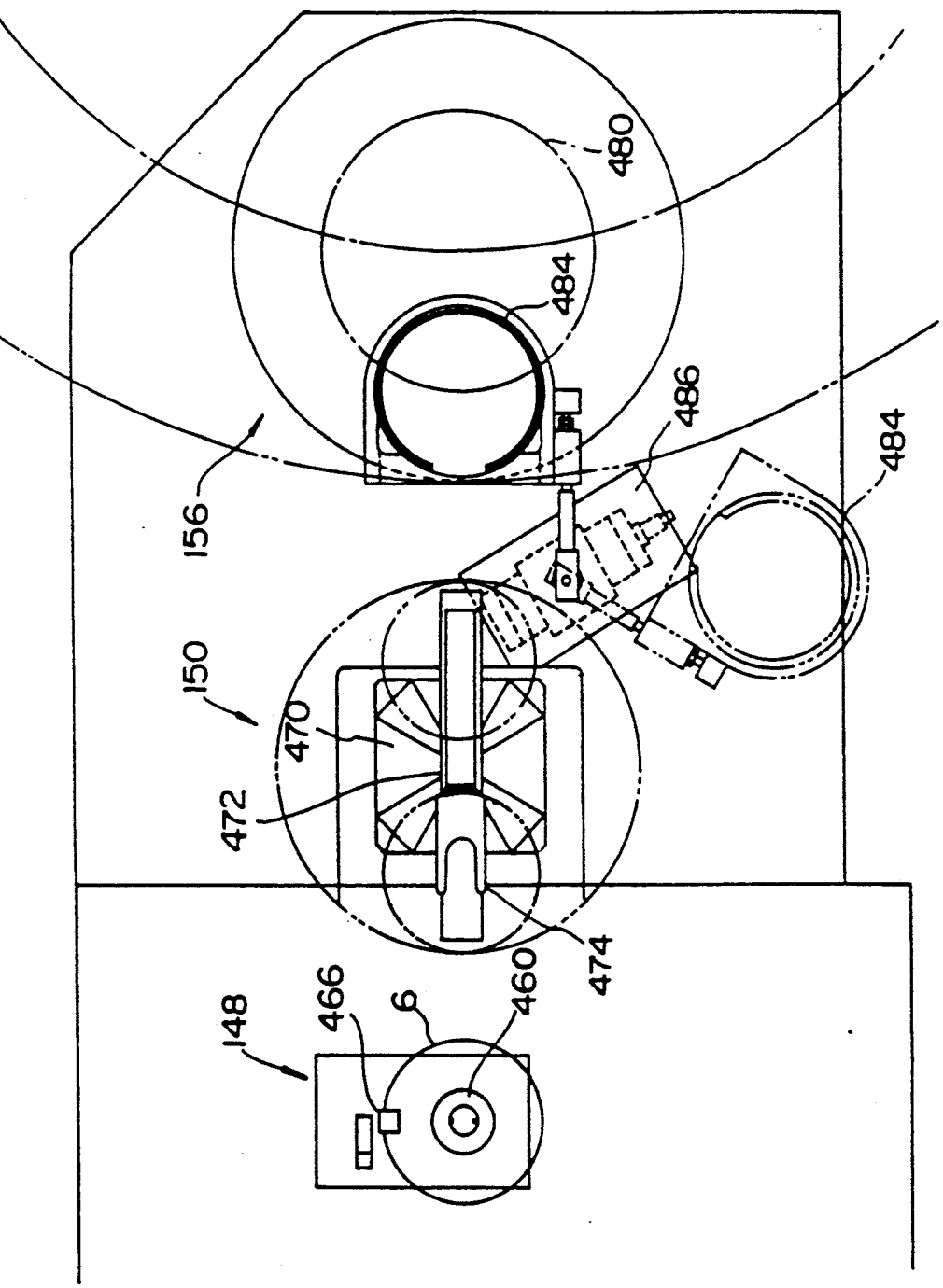
FIG. 34 is a plane view of the machine surrounding parts in OF position.
Figure 35:
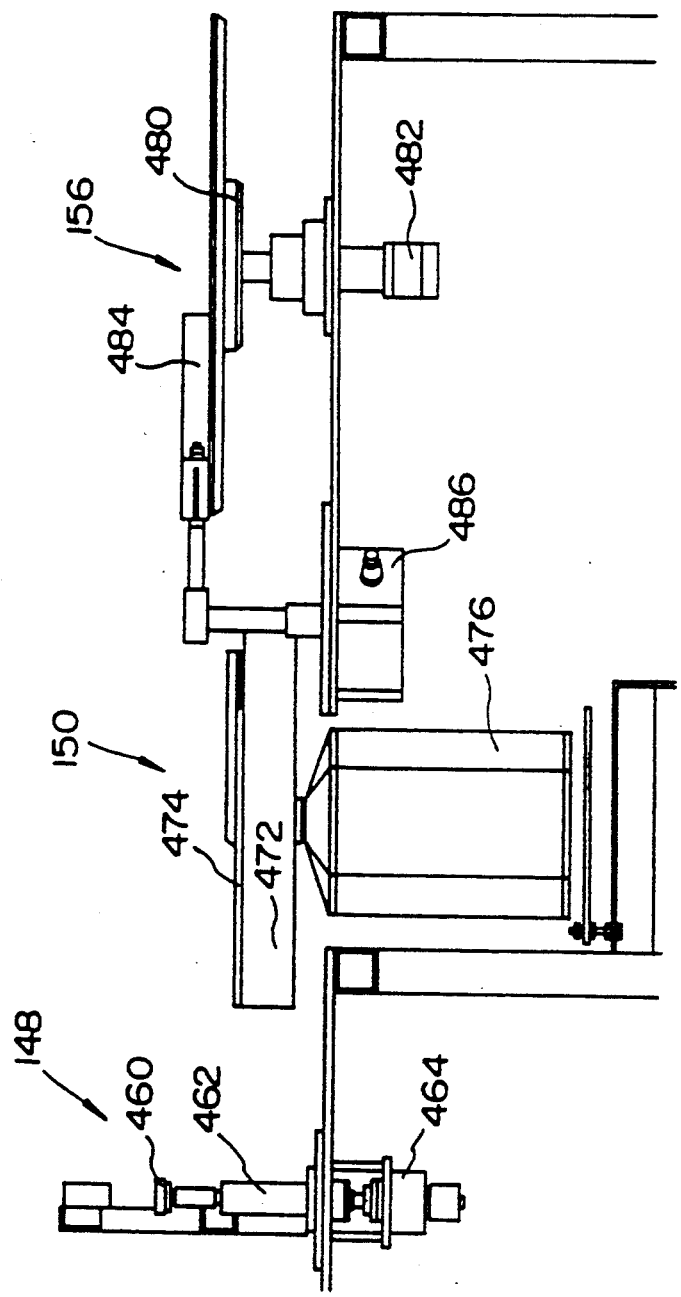
FIG. 35 is side view of the parts shown in 34.
Figure 36:
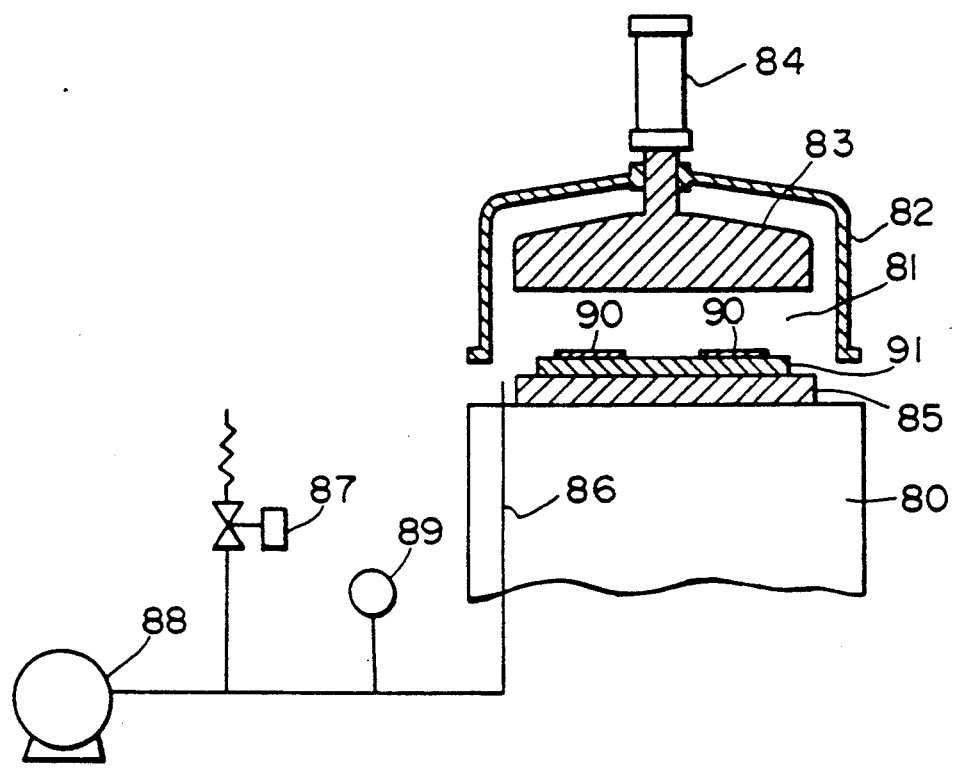
FIG. 36 is a cross section view of a prior art binding apparatus.

In the OF position alignment apparatus 148, a turn table 460 is provided. This turn table moves upward and downward by means of an pneumatic cylinder 462 and rotates by means of motor 464. Additionally, an OF detector 466 is provided around the periphery of the turn table 460. This OF detector decides the position of the OF portion of the wafer 6, depending on the detection of whether the light beam is intercepted or not. Depending on this decision, by controlling the stoppage of the motor 464, as shown in FIG. 34, OF can be stopped at a predetermined angle.

In the carrier means 158 a rotating body 472 is provided which rotates by means of a motor 470. On top of this rotating body 472, an arm 474 is provided which is capable of moving radially. This arm 474 can also extend in the direction of the above mentioned turn table 460. Therefore, when the aforementioned turn table 460 is in the upraised position (the arm 474 may be relatively lowered), the arm 474 is extended and then by lowering the turn table 460 (the arm 474 is relatively raised), the wafer 6 is placed on top of the arm 474. With the wafer 6 placed on top, the arm 474 is then rotated 180 degrees and swung towards the wafer setting unit 156. In @his wafer unit, a turn table 480 is provided upon which a wafer carrier 5 is placed. According to the driving of this turn table 480 by a motor 482, the wafer storage cavity of the wafer carrier 5 is brought to a position on line with the above mentioned rotating body 472.

In between the above mentioned carrier means 158 and the wafer setting unit 152, a wafer guiding apparatus 484 is provided. This wafer guiding apparatus 484 is driven by means of a rotary coil 486 and can be moved to the position of the solid line as well as the position of the dotted line, as shown in FIG. 34. Specifically, when the above mentioned arm 474 is lowered, the wafer 6 is guided to a predetermined position on top of the wafer carrier 5, shown by the solid line in the figure. Additionally, when trying to adhere the wafer carrier 5 by means of the adhesive means 344 provided on the arm 342 of the aforementioned wafer movement machine 156, the wafer carrier is arranged to a position separated from the movement path of the above mentioned adhesive means 344, namely to the position of the broken line shown in the figure.

The aforementioned turn table 480 is arranged in a position on top of the rotation tracks of the arm 342 of the above mentioned wafer movement machine 156. By means of this arm 342, both the carrying in of the empty wafer carrier 5 and the carrying out of the wafer carrier 5 with the wafer 6 in the predetermined position are performed.

The movements of the wafer binding apparatus formed in the above manner will now be explained.

The carrier plates 7 are stacked vertically inside of the carrier plate stock unit 100. The carrier plates 7 housed inside of the carrier plate stock unit are fed to the washing apparatus 106, one at a time, by a carrier means 104 and are transported to each step of the washing means 106 during the washing process. The binding surface of the washed carrier plate 7 is then turned upward and fed to a drying apparatus 11: once the water portion is removed, the carrier plate 7 is fed to the heating apparatus 118. Once fed to the heating apparatus, the carrier plate 7, by means of the carrier means 126, is taken through each step of the drying process. The carrier plate 7, once it has reached the last heating unit 124, is then picked up by a carrier plate transportation machine 314: the carrier plate 7 is then turned about and after the binding face has been turned downward, is made to wait at the side of the binding machine 128.

Meanwhile, once the position of the wafer has been set by the centering apparatus 140, the wafer 6 is washed by means of the washing apparatus 142 and coated with binding agent by means of the wax coater 144. The solvent is then evaporated in the hot baking apparatus 146, and after the position of the wafer 6 is set by the OF position alignment apparatus 148, the wafers are fed, one at a time, to the wafer setting unit 152 by means of the wafer setting robot 158. Additionally, at the same time as this feeding, the transportation of other wafers is being carried out over the intervals between the aforementioned centering apparatus 140, washing apparatus 142, wax coater 144, hot baking apparatus 146 and OF position alignment apparatus 148.

The wafer carrier 5 is prepared on top of the wafer carrier holder 154 and then fed to the aforementioned wafer setting apparatus by means of the wafer transportation machine arm 342. In the wafer setting apparatus, the wafer 6 is inserted into the wafer carrier 5, in accordance with the mutual execution of both the feeding of the wafer 6, by means of the aforementioned wafer setting robot 158, and the rotation to the predetermined angle of the turn table 480.

When a fixed number of wafers are inserted into the wafer carrier 5, the wafer transportation machine 156 feeds the wafer carrier 5 to the binding apparatus 128. After the carrier plate 7 has been fed to the binding apparatus by means of the carrier plate transportation machine 314, the wafer carrier 5, wafer 6 and carrier plate 7 are arranged in the predetermined positions as shown in FIG. 2. In this arrangement, the binding apparatus 128 moves and the wafer 6 is bonded to the lower surface of the carrier plate 7.

After binding, the carrier plate transportation machine 316 attaches to the inner side of the carrier plate 7 and lifts the carrier plate 7: after the surface bonded to the wafer 6 is rotated so that it is facing upward, the carrier plate is placed on the first cooling unit 162 of the cooling apparatus 160.

In the cooling apparatus 160, the carrier plate 7 is slowly cooled while being transported, by means of the carrier means 126, to each of the cooling units 162, 164 and 166. In the cooling apparatus 160, after an identification mark is attached to the carrier plate 7, which is cooled until a predetermined temperature is reached, is sent to the polishing process.

The carrier and washing means, in the above described apparatus, are not just restricted to the given examples, and can, of course, be modified according to the dimensions and resources of the wafer.

The apparatus in the above mentioned example, wherein in a binding apparatus the wafer is pressed up against the lower surface of the carrier plate which has been turned downwards, is capable of feeding the wafer and carrier plate to the ultimate binding position for this binding. Therefore, the binding apparatus can essentially preserve results such as the prevention of air bubbles on the binding surface and the improvement of the wafer flatness by removing the particles on the wax coated surface of the wafer in addition to efficiently feeding the wafer and carrier plate to the binding apparatus.

What is claimed is:

1. A wafer binding apparatus comprising:
   a tightly sealed first decompression chamber,
   a tightly sealed second decompression chamber provided at the lower portion of said first decompression chamber,
   a diaphragm which divides said decompression chambers,
   a wafer carrier, provided in said first decompression chamber and a carrier plate and wafers to be bonded to said carrier plate in the upper plate of said diaphragm, and
   a pressure control means for controlling the pressure inside of both said decompression chambers,
   in said wafer carrier there are provided:
   a wafer supporting part for supporting each of said wafers in a position facing the upper surface of said diaphragm, and
   a carrier plate supporting part for supporting said carrier plate in a fixed spacing in the interval between the upper surface of said wafer and said wafer supporting part,
   wherein said pressure control means lowers the pressure in both of said decompressing chambers at the same time and then increases the pressure of said second decompression chamber relative to said first decompression chamber so that the position of said diaphragm is changed such that said diaphragm is drawn near to said carrier plate through said fixed spacing extending in between.

2. A wafer binding apparatus according to claim 1 wherein said pressure control means lowers the pressure in both of said decompression chambers at the same time below the atmospheric pressure level.

3. A wafer binding apparatus according to claim 1 wherein said pressure control means keeps the pressure in said first decompression chamber below the atmospheric pressure level throughout the period of a binding process.

4. A wafer binding apparatus according to claim 2 wherein said pressure control means keeps the pressure in said first decompression chamber below the atmospheric pressure level throughout the period of a binding process.

5. A wafer binding apparatus according to claim 1 wherein a press plate is provided in the upper side of said carrier plate so as to press the carrier plate which tends to move upward.

6. A wafer binding apparatus according to claim 2 wherein a press plate is provided in the upper side of said carrier plate so as to press the carrier plate which tends to move upward.

7. A wafer binding apparatus according to claim 3 wherein a press plate is provided in the upper side of said carrier plate so as to press the carrier plate which tends to move upward.

8. A wafer binding apparatus according to claim 4 wherein a press plate is provided in the upper side of said carrier plate so as to press the carrier plate which tends to move upward.

* * * * *